(12) United States Patent
Ono

(10) Patent No.: US 6,496,954 B1
(45) Date of Patent: Dec. 17, 2002

(54) VITERBI DECODER AND VITERBI DECODING METHOD

(75) Inventor: Mitsuhiro Ono, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/505,896

(22) Filed: Feb. 17, 2000

(30) Foreign Application Priority Data

Feb. 18, 1999 (JP) ............................................. 11-040633

(51) Int. Cl.[7] .............................................. H03M 13/00
(52) U.S. Cl. ...................................... 714/795; 375/341
(58) Field of Search ................................ 714/786, 792, 714/795; 375/341, 265

(56) References Cited

U.S. PATENT DOCUMENTS

| | | | | |
|---|---|---|---|---|
| 5,379,306 A | * | 1/1995 | Noma et al. ................. | 714/792 |
| 5,469,452 A | * | 11/1995 | Zehavi ........................ | 714/792 |
| 5,497,401 A | * | 3/1996 | Ramaswamy et al. ...... | 375/341 |
| 5,841,819 A | * | 11/1998 | Hu et al. ..................... | 375/341 |
| 6,389,083 B1 | * | 5/2002 | Hori ............................ | 375/341 |

OTHER PUBLICATIONS

Moriwaki et al., New Product 4 ADSL Chipset, NEC Device Technology International, No. 54, 7–1999. p. 1–6.*

* cited by examiner

Primary Examiner—Albert Decady
Assistant Examiner—Shelly A Chase
(74) Attorney, Agent, or Firm—Whitham, Curtis & Christofferson, P.C.

(57) ABSTRACT

A Viterbi decoder comprises a coordinate data separating system which inputs coordinate data, and which outputs high order coordinate data and low order coordinate data. The coordinate data have an integer part of n bits and a decimal part of m bits which indicate a receiving constellation coordinate. The high order coordinate data have high order n−1 bits of the coordinate data. The low order coordinate data have low order m+1 bits of the coordinate data. The Viterbi decoder comprises also a de-mapping system which converts the high order coordinate data into a predetermined bit string, and a Viterbi pre-processing system which inputs the low order coordinate data and the bit string, and which outputs correcting data, post-processing data and the bit string. The correcting data have low order m bits of the bit string and the low order coordinate data. The post-processing data have high order 1 bit of the low order coordinate data. The Viterbi decoder comprises also a Viterbi decoding system which inputs the correcting data, and which outputs a corrected low order bit string, and a Viterbi post-processing system which inputs the corrected low order bit string, the post-processing data and the bit string, and which outputs a corrected bit string. The corrected low order bit string is obtained by correcting a low order bit string having low order 2 bits of the bit string.

28 Claims, 21 Drawing Sheets

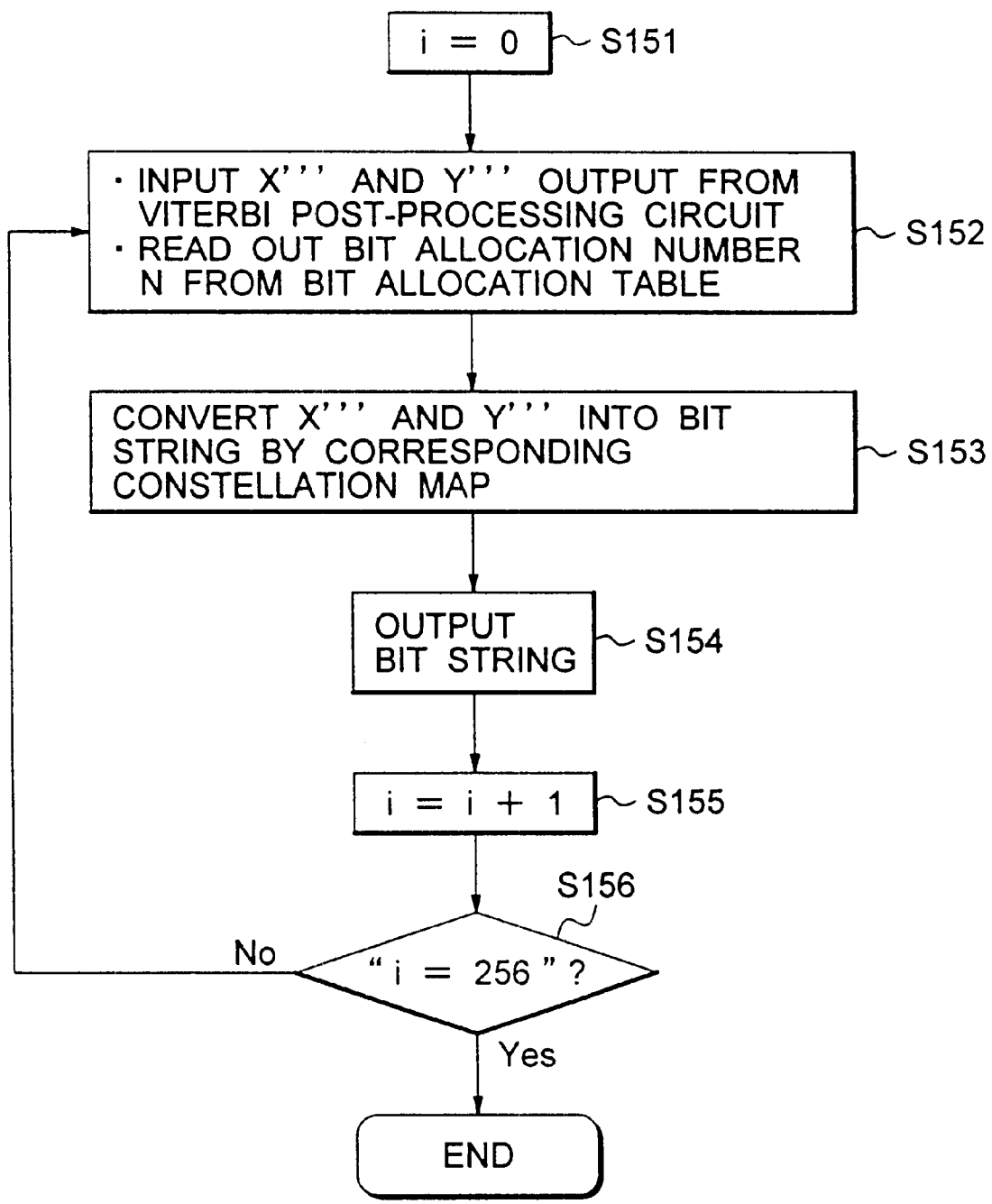

VITERBI DECODER AND VITERBI DECODING METHOD

BACKGROUND OF THE INVENTION

1. Field of the Invention

The present invention relates to a Viterbi decoder and a Viterbi decoding method which are to be used for decoding a received signal, and more particularly to a Viterbi decoder and a Viterbi decoding method which are suitable for an ADSL (Asymmetric Digital Subscriber Line) modem.

2. Description of the Related Art

In recent years, the introduction of an ADSL (Asymmetric Digital Subscriber Line) has been examined in the field of a wide-band multimedia telecommunication. The ADSL is a network in which an up transmission speed from a individual home to a telephone station is set to 16 kbps to 1.3 Mbps, for example, and a down transmission speed from the telephone station to the individual home is set to 1.5 Mbps to 12 Mbps, for example, and the transmission speeds are thus asymmetrical.

In such an ADSL, the specification of a transmitter is standardized. FIG. 1 is a block diagram showing an encoder provided on a transmitter in the ADSL.

The encoder provided on the transmitter is provided with a Trellis encoding circuit 27 for adding an error correction code to de-map data before mapping. Moreover, the encoder is provided with a tone ordering buffer memory 23 for storing data output from the Trellis encoding circuit 27 and rearranging, in the order of a frequency, carriers arranged in the order of an allocated bit number to be described below. Furthermore, the encoder is provided with a tone ordering table 25 in which tone ordering table data to be used for the above-mentioned rearrangement is stored and with a read/write controller 24 for controlling the storage and read of the data in the tone ordering buffer memory 23 based on the tone ordering table data. There is provided a transmitting bit allocation table 22 in which a bit allocation number N ($\leq 15$) of an i-th carrier to be transmitted is stored, and a mapping circuit 21 for mapping the data output from the tone ordering buffer memory 23 for each carrier based on a constellation map. A transmitting constellation X coordinate and a transmitting constellation Y coordinate are output for each carrier from the mapping circuit 21. Thus, the mapping data are encoded into the transmitting constellation X coordinate and the transmitting constellation Y coordinate.

FIG. 2 is a diagram typically showing a constellation map obtained when the bit allocation number is 4 bits. A sent signal is allocated to a point having odd-numbered X and Y coordinates. This allocation is similarly carried out for any bit allocation number. If the bit allocation number is 4 bits, a constellation coordinate of (1, 3) is obtained when data of "0001" is transmitted and a constellation coordinate of (−3, −1) is obtained when data of "1101" is transmitted.

As described, the maximum number of the bit allocation number is 15 bits. Therefore, the maximum bit number of the transmitting constellation X coordinate and the transmitting constellation Y coordinate is 9 bits. More specifically, in the case where the number of dots as black circles is extended to 15×15 as shown in FIG. 2, the maximum value of the X and Y coordinates is 9 bits in a binary number.

Then, the encoded data are related to 256 carriers provided in a frequency band between 4 kHz to 1 MHz for one symbol. The above-mentioned bit allocation number is a bit number to be allocated to each carrier.

Next, the transmitting constellation X coordinate and the transmitting constellation Y coordinate are subjected to inverse fast Fourier transform (IFFT) and are transmitted to a receiver.

Under the present circumstances, however, the specification of the transmitter is standardized as described above, while the structure of the Viterbi decoder to be used corresponding to the encoder and provided on the receiver is not standardized. For this reason, a Viterbi decoder capable of being used for the receiver and carrying out the decoding operation with high precision has been required.

SUMMARY OF THE INVENTION

It is an object of the present invention to provide a Viterbi decoder and a Viterbi decoding method which can be used for an ADSL modem and can preferably simplify the structure of a circuit.

According to one aspect of the present invention, a Viterbi decoder comprises a coordinate data separating system which inputs coordinate data, and which outputs high order coordinate data and low order coordinate data. The coordinate data have an integer part of n bits and a decimal part of m bits which indicate a receiving constellation coordinate. The high order coordinate data have high order n−1 bits of the coordinate data. The low order coordinate data have low order m+1 bits of the coordinate data. The Viterbi decoder comprises also a de-mapping system which converts the high order coordinate data into a predetermined bit string, and a Viterbi pre-processing system which inputs the low order coordinate data and the bit string, and which outputs correcting data, post-processing data and the bit string. The correcting data have low order m bits of the bit string and the low order coordinate data. The post-processing data have high order 1 bit of the low order coordinate data. The Viterbi decoder comprises also a Viterbi decoding system which inputs the correcting data, and which outputs a corrected low order bit string, and a Viterbi post-processing system which inputs the corrected low order bit string, the post-processing data and the bit string, and which outputs a corrected bit string. The corrected low order bit string is obtained by correcting a low order bit string having low order 2 bits of the bit string.

According to the present invention, a substantially reverse process to the process in the transmitter is carried out. Therefore, the decoding operation can be performed with high precision.

According to another aspect of the present invention, a Viterbi decoder comprises a Viterbi pre-processing system which inputs coordinate data, and which outputs high order coordinate data and low order coordinate data. The coordinate data have an integer part of n bits and a decimal part of m bits which indicate a receiving constellation coordinate. The high order coordinate data have high order n−1 bits of the coordinate data, and the low order coordinate data having low order m+1 bits of the coordinate data. The Viterbi decoder comprises also a Viterbi decoding system which inputs the low order coordinate data, and which outputs post-processing data. The post-processing data is obtained by error-correcting high order 1 bit of the low order coordinate data. The Viterbi decoder comprises also a Viterbi post-processing system which inputs the high order coordinate data and the post-processing data, and which outputs error-corrected coordinate data, and a de-mapping system which converts the error-corrected coordinate data into a predetermined bit string.

According to the present invention, the error correction is carried out prior to the conversion into the bit string.

Therefore, it is possible to carry out the decoding operation with high precision and to simplify the structure of the means for converting the bit string.

According to another aspect of the present invention, A Viterbi decoding method comprises the steps of: separating coordinate data into high order coordinate data and low order coordinate data, the coordinate data having an integer part of n bits and a decimal part of m bits which indicate a receiving constellation coordinate, the high order coordinate data having high order n−1 bits of the coordinate data, and the low order coordinate data having low order m+1 bits of the coordinate data; converting the high order coordinate data into a predetermined bit string; generating correcting data and post-processing data from the low order coordinate data and the bit string, the correcting data having low order m bits of the bit string and the low order coordinate data, and the post-processing data having high order 1 bit of the low order coordinate data; generating a corrected low order bit string from the correcting data, the corrected low order bit string being obtained by correcting a low order bit string having low order 2 bits of the bit string; and generating a corrected bit string from the corrected low order bit string, the post-processing data and the bit string.

According to another aspect of the present invention, a Viterbi decoding method comprises the steps of: generating high order coordinate data and low order coordinate data from coordinate data, the coordinate data having an integer part of n bits and a decimal part of m bits which indicate a receiving constellation coordinate, the high order coordinate being obtained by adding 1 to high order n bits of the coordinate data, and the low order coordinate having low order m+2 bits of the coordinate data; generating post-processing data obtained by error-correcting high order 1 bit of the low order coordinate data from the low order coordinate data; generating error-corrected coordinate data from the high order coordinate data and the post-processing data; and converting the error-corrected coordinate data into a predetermined bit string.

BRIEF DESCRIPTION OF THE DRAWINGS

FIG. 21 is a flowchart showing the operation of a de-map circuit 11.

DETAILED DESCRIPTION OF THE PREFERRED EMBODIMENTS

Figure 1:
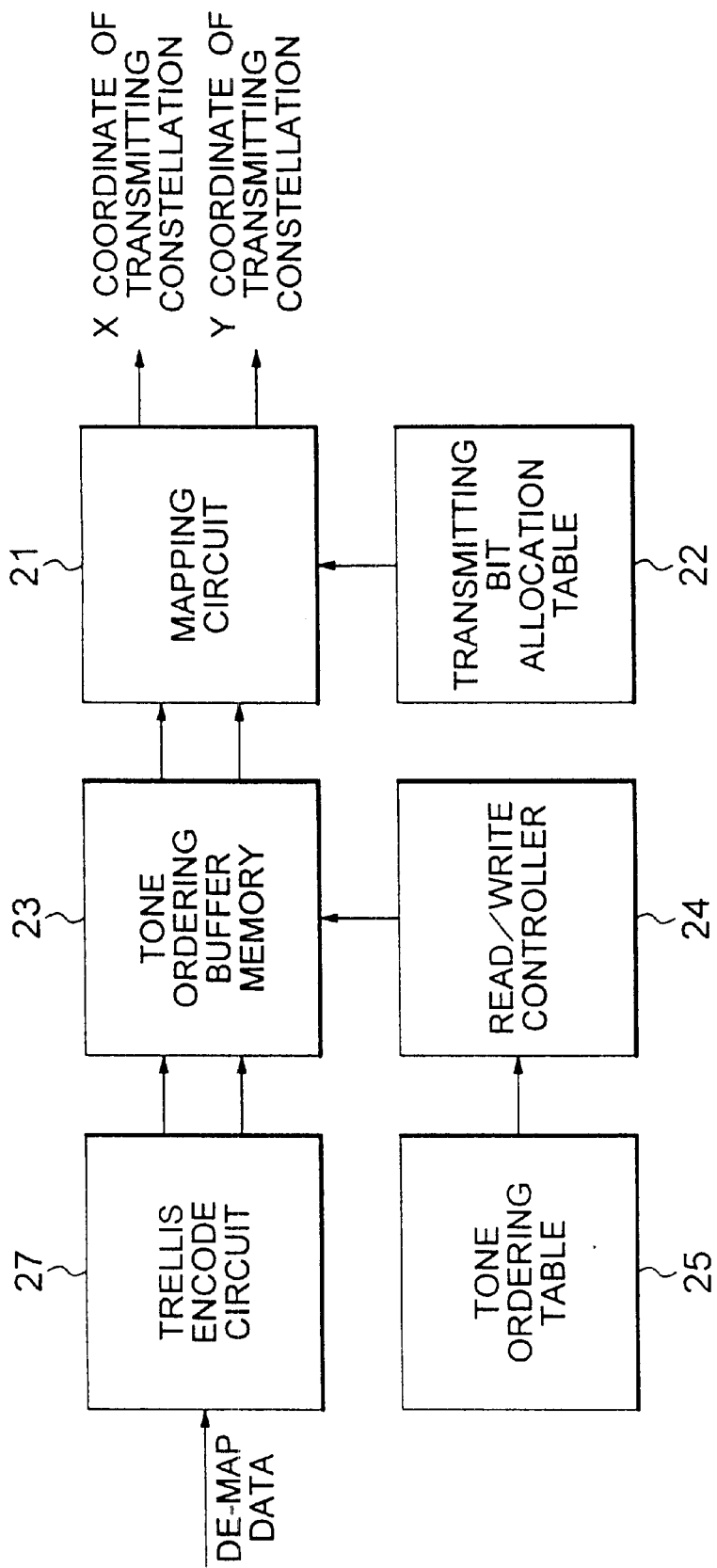
FIG. 1 is a block diagram showing an encoder provided on a transmitter in an ADSL.

A Viterbi decoder according to an embodiment of the present invention will be specifically described with reference to the accompanying drawings. According to a first embodiment, a Viterbi decoder has such a structure that the configuration of an encoder provided on the transmitter shown in FIG. 1 is reversed. Moreover, noises in a signal the transfer from the transmitter to a receiver. In the first embodiment, therefore, receiving constellation X and Y coordinates are input as 11-bit data comprising an integer part of 9 bits and a decimal part of 2 bits, respectively.

Figure 2:
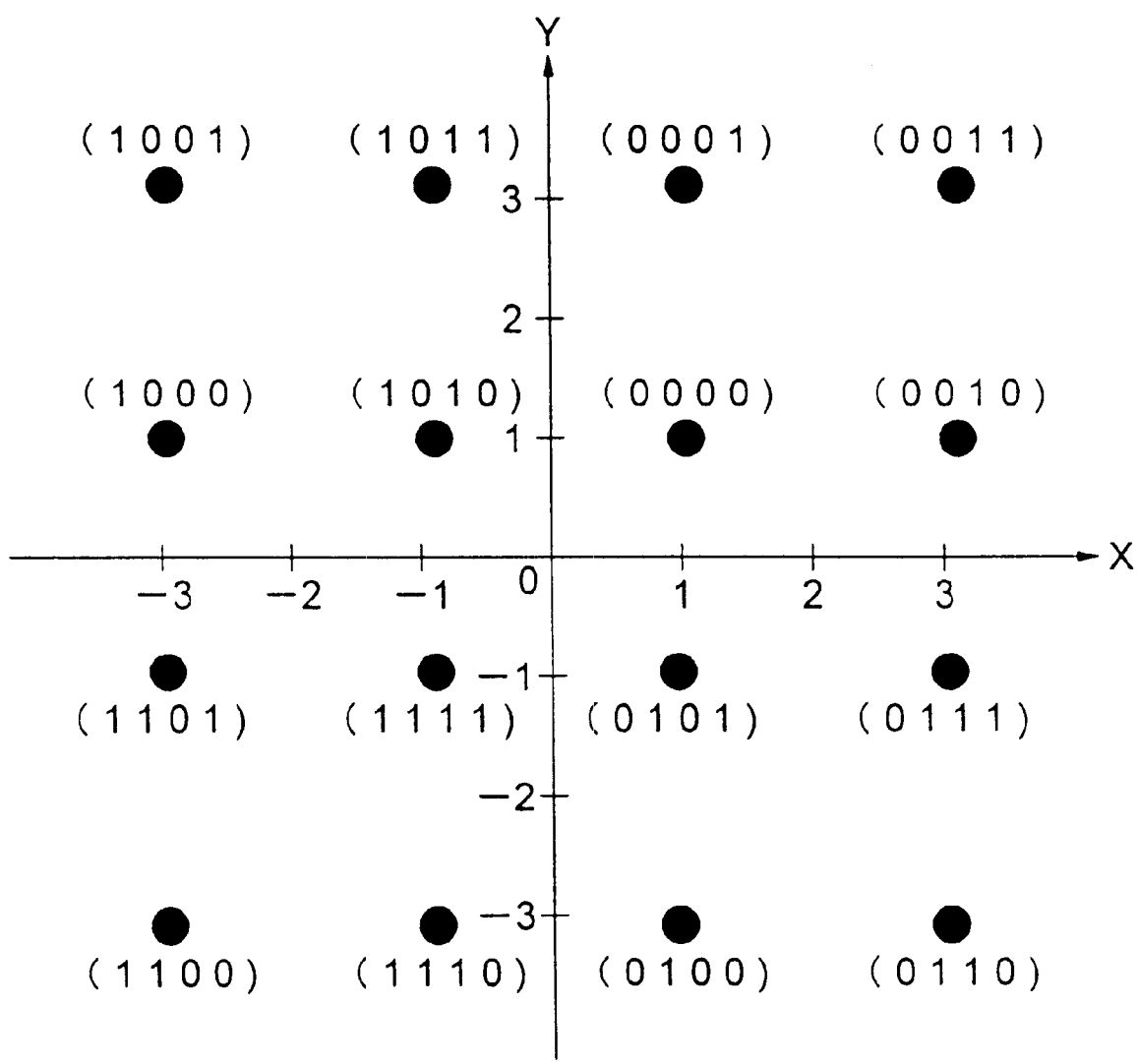
FIG. 2 is a diagram typically showing a constellation map with a bit allocation number of 4 bits.

In a constellation map used in the present embodiment, the least significant bit of a bit string given to each coordinate is coincident with a second bit from the least significant with the Y coordinate represented in a binary, and the second bit from the least significant of a bit string given to each coordinate is coincident with a second bit from the last bit with the X coordinate represented in a binary (see FIG. 2). The constellation map is identical to a constellation map in the transmitter.

Figure 3:
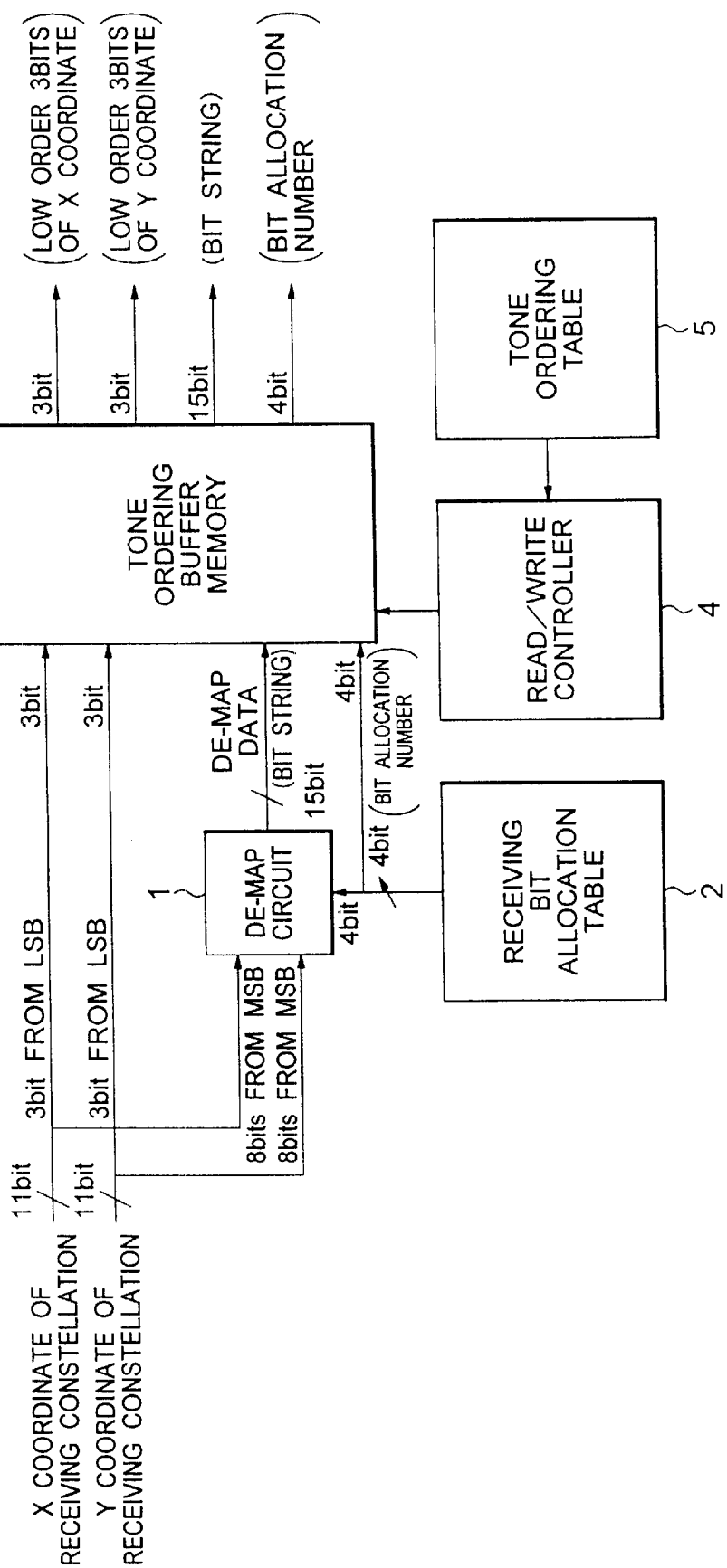
FIG. 3 is a block diagram showing a Viterbi decoder according to a first embodiment of the present invention.
Figure 4:
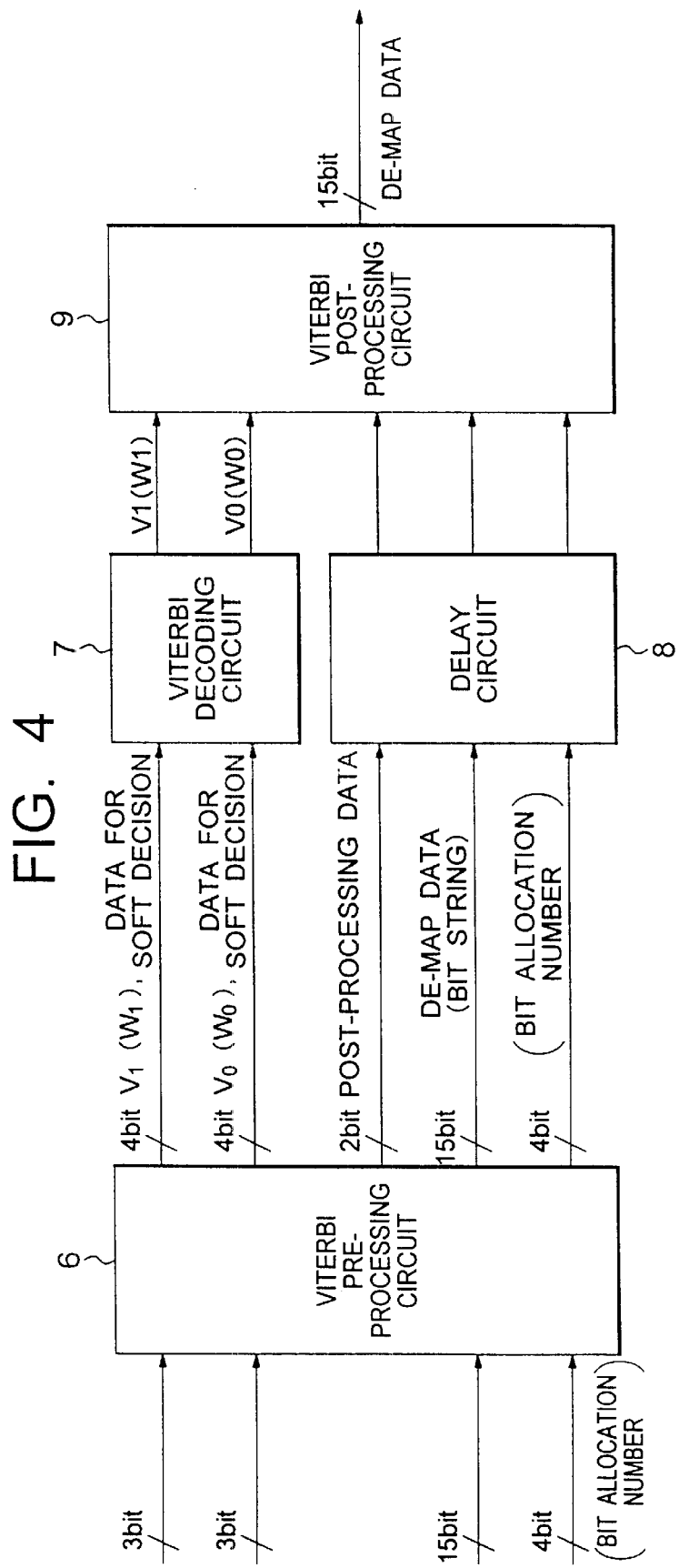
FIG. 4 is a block diagram showing the Viterbi decoder according to the first embodiment of the present invention, illustrating a next stage of FIG. 3.

FIGS. 3 and 4 are block diagrams showing a Viterbi decoder according to the first embodiment of the present invention.

According to the first embodiment, as shown in FIG. 3, there is provided a de-map circuit 1 for inputting high order 8 bits X' of the 11-bit receiving constellation X coordinate and high order 8 bits Y' of the 11-bit receiving constellation Y coordinate. X' and Y' are converted into bit strings by the de-map circuit 1.

Moreover, there is provided a receiving bit allocation table 2 in which a bit allocation number N ($\leq 15$) of the i-th received carrier is stored.

Furthermore, there is provided a tone ordering buffer memory 3 for inputting a bit string having low order 3 bits of the 11-bit receiving constellation X coordinate, low order 3 bits of the 11-bit receiving constellation Y coordinate and 15 bits output from the de-map circuit 1. The data corresponding to carriers which are rearranged in order of a frequency by the transmitter are rearranged in order of an allocated bit number by means of the tone ordering buffer memory 3.

Moreover, the Viterbi decoder comprises a tone ordering table 5 in which tone ordering table data to be used for the above-mentioned carrier rearranging operation are stored, and a read/write controller 4 for controlling the storage and read of the data in the tone ordering buffer memory 3 based on the tone ordering table data.

In the present embodiment, as shown in FIG. 4, the Viterbi decoder comprises a Viterbi pre-processing circuit 6 for inputting a bit string having low order 3 bits and 15 bits of the receiving constellation X and Y coordinates which are output from the tone ordering buffer memory 3 shown in FIG. 3. By the Viterbi pre-processing circuit 6, data necessary for Viterbi decoding and data unnecessary for the Viterbi decoding are separated and output.

The Viterbi decoder further comprises a Viterbi decoding circuit 7 for inputting data necessary for the Viterbi decoding operation which are output from the Viterbi pre-processing circuit 6. By the Viterbi decoding circuit 7, the Viterbi decoding operation using an error-correcting code is carried out.

Moreover, the Viterbi decoder comprises a delay circuit 8 for inputting a bit allocation number N and data unnecessary for the Viterbi decoding operation which are output from the Viterbi pre-processing circuit 6. By the delay circuit 8, the delay equal to the Viterbi decoding operation which is carried out by the Viterbi decoding circuit 7 is given to data transmission.

The Viterbi decoder further comprises a Viterbi post-processing circuit 9 for inputting data output from the Viterbi decoding circuit 7 and data to which the delay is given by the delay circuit 8.

Figure 5:
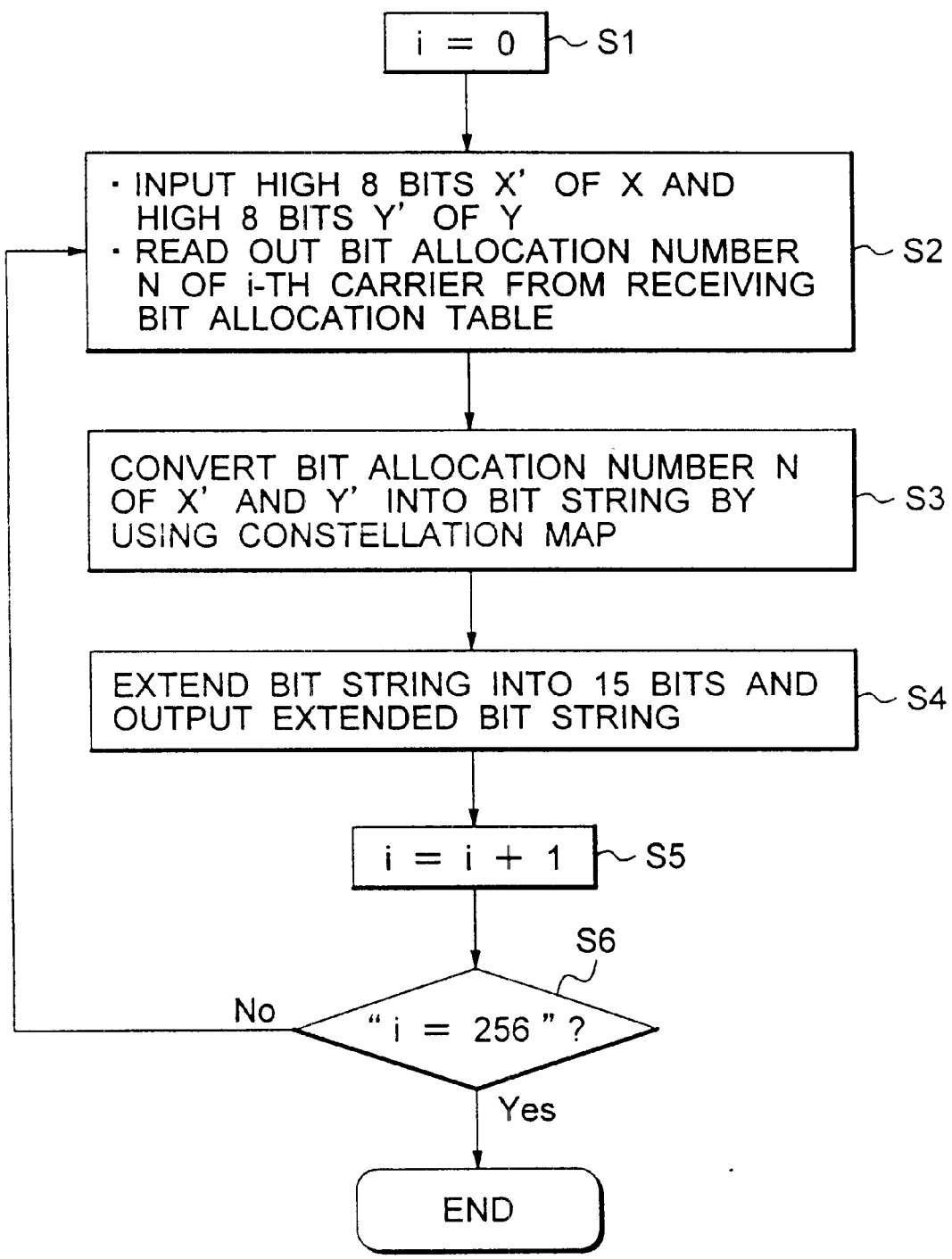
FIG. 5 is a flowchart showing the operation of a de-map circuit 1.
Figure 6:
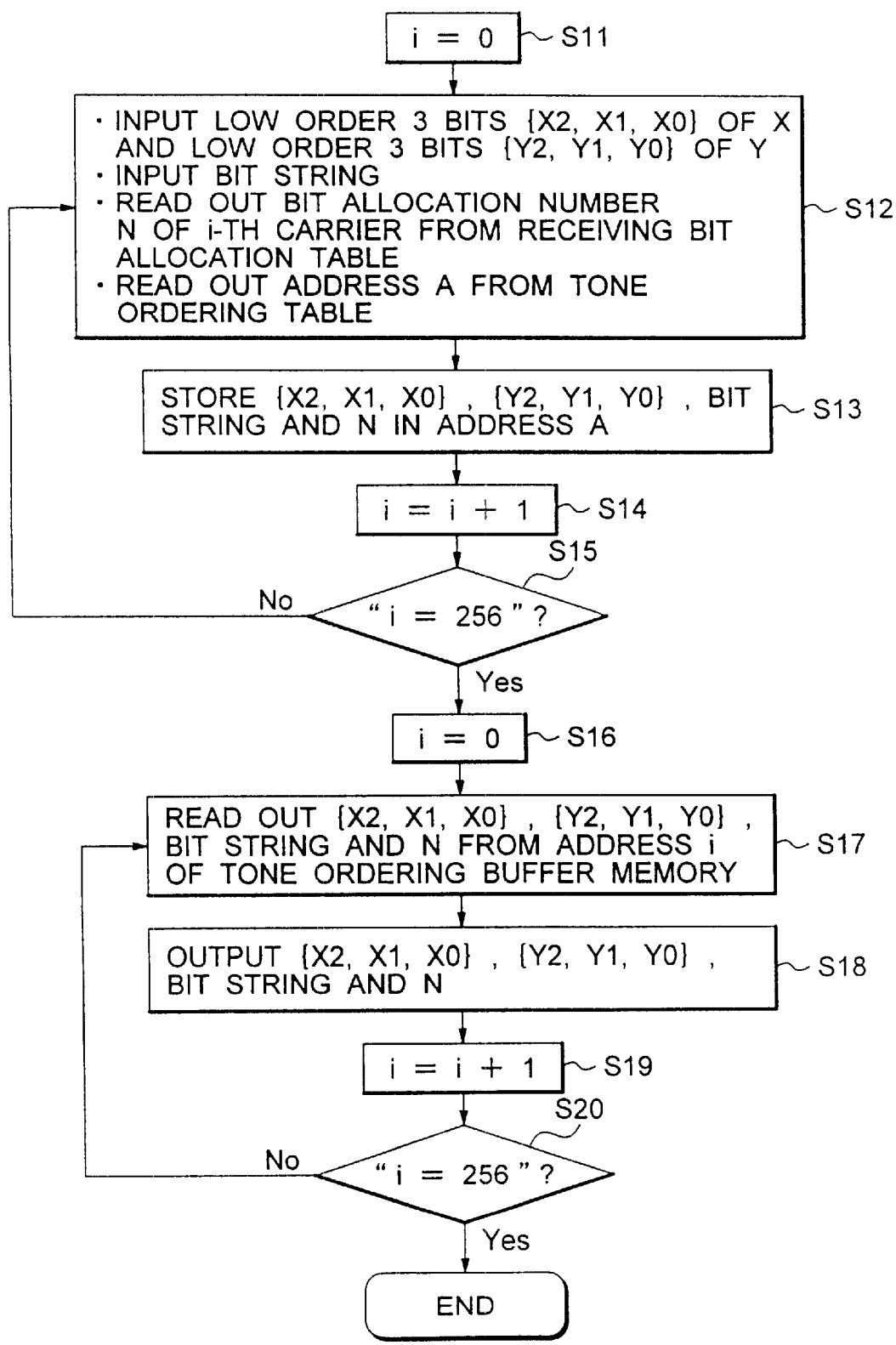
FIG. 6 is a flowchart showing the operation of a tone ordering buffer memory 3.
Figure 7:
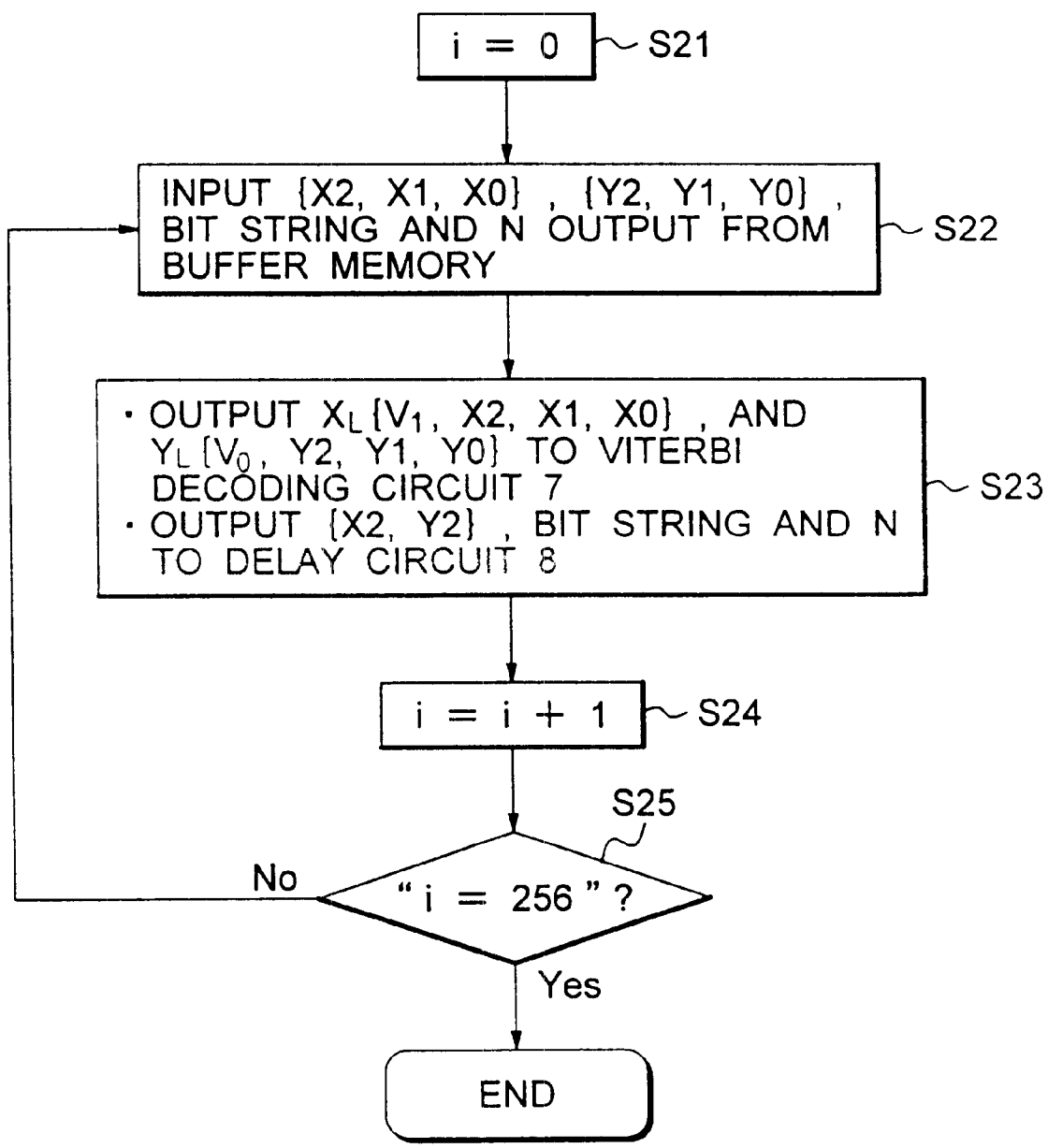
FIG. 7 is a flowchart showing the operation of a Viterbi pre-processing circuit 6.
Figure 8:
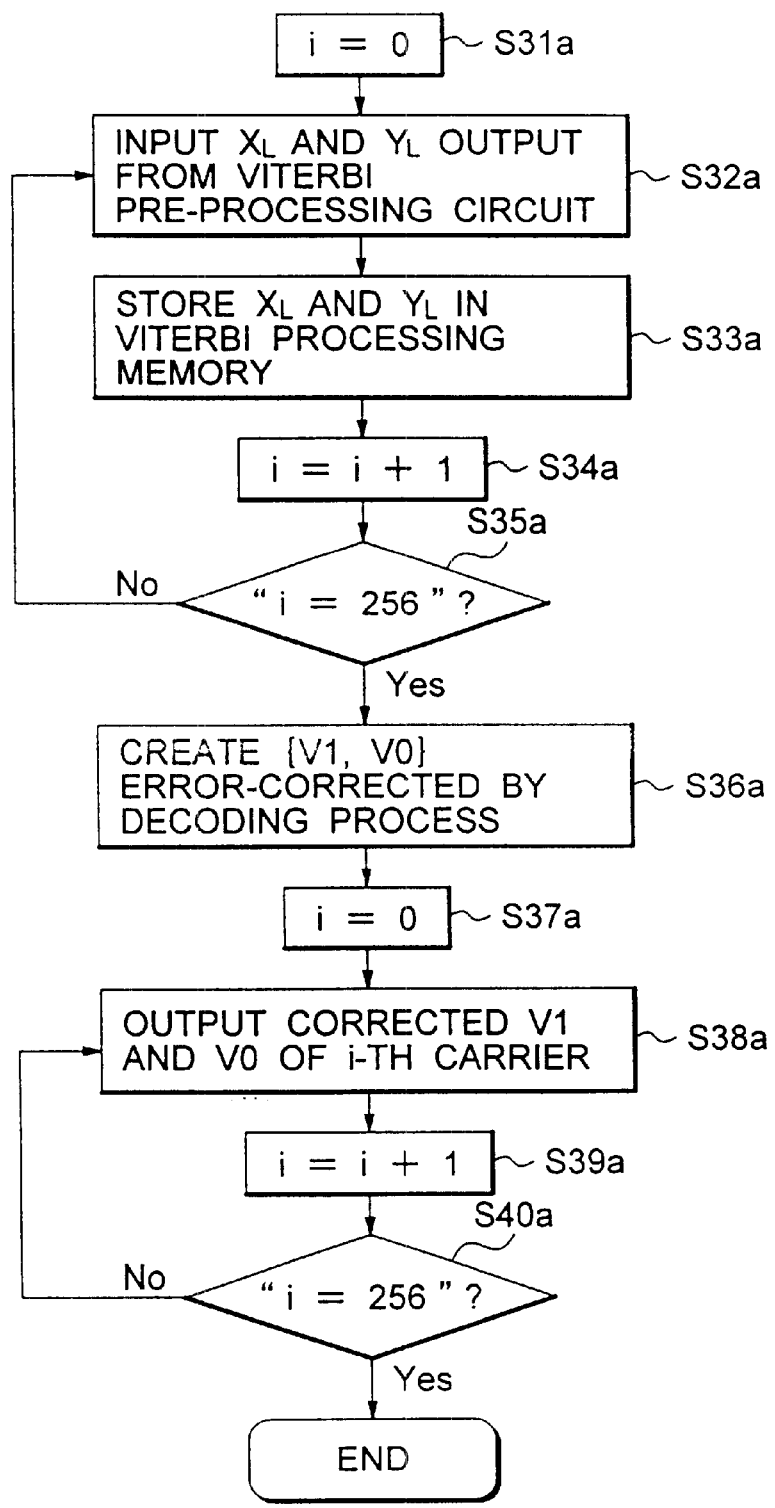
FIG. 8 is a flowchart showing the operation of a Viterbi decoding circuit 7.
Figure 9:
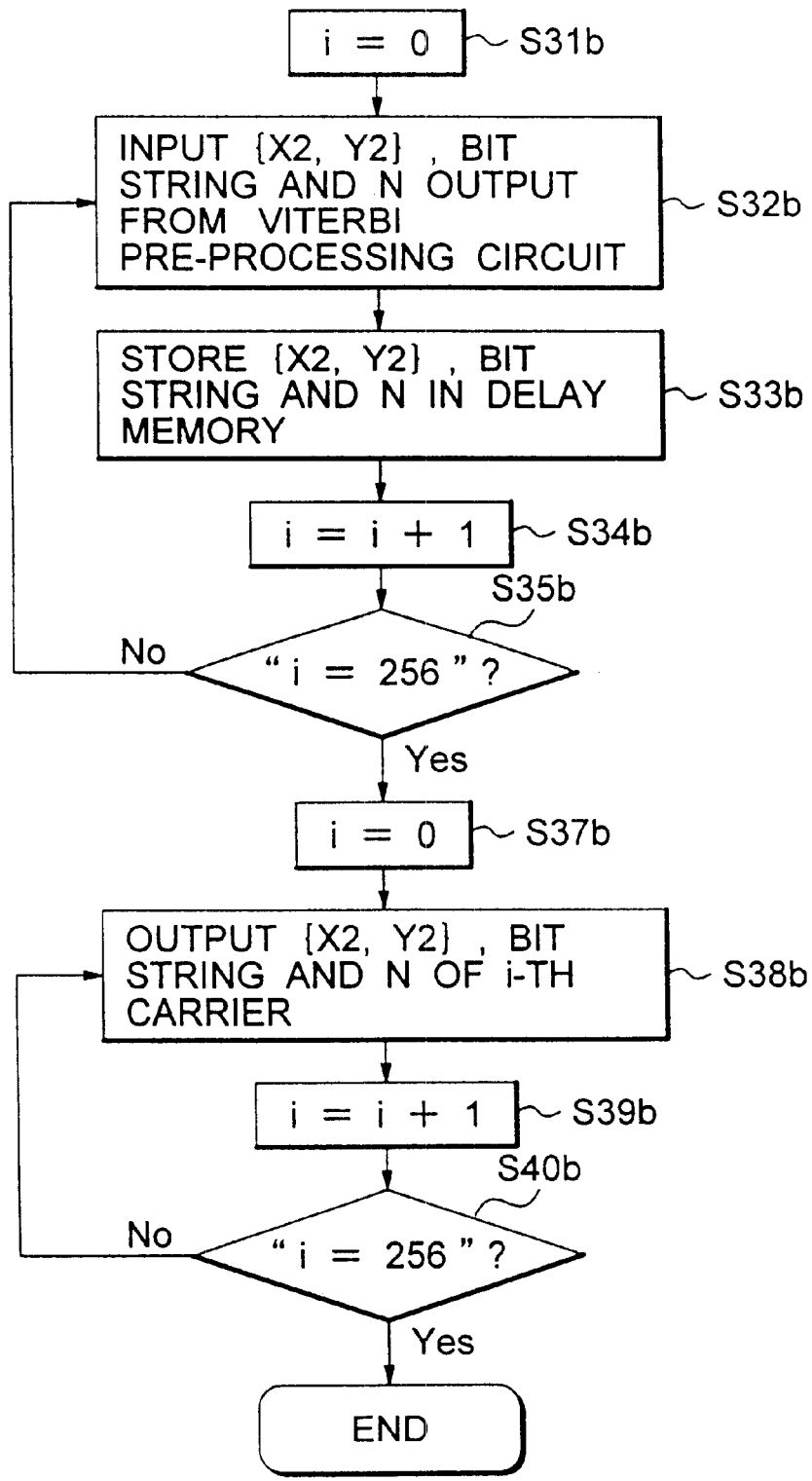
FIG. 9 is a flowchart showing the operation of a delay circuit 8.
Figure 10:
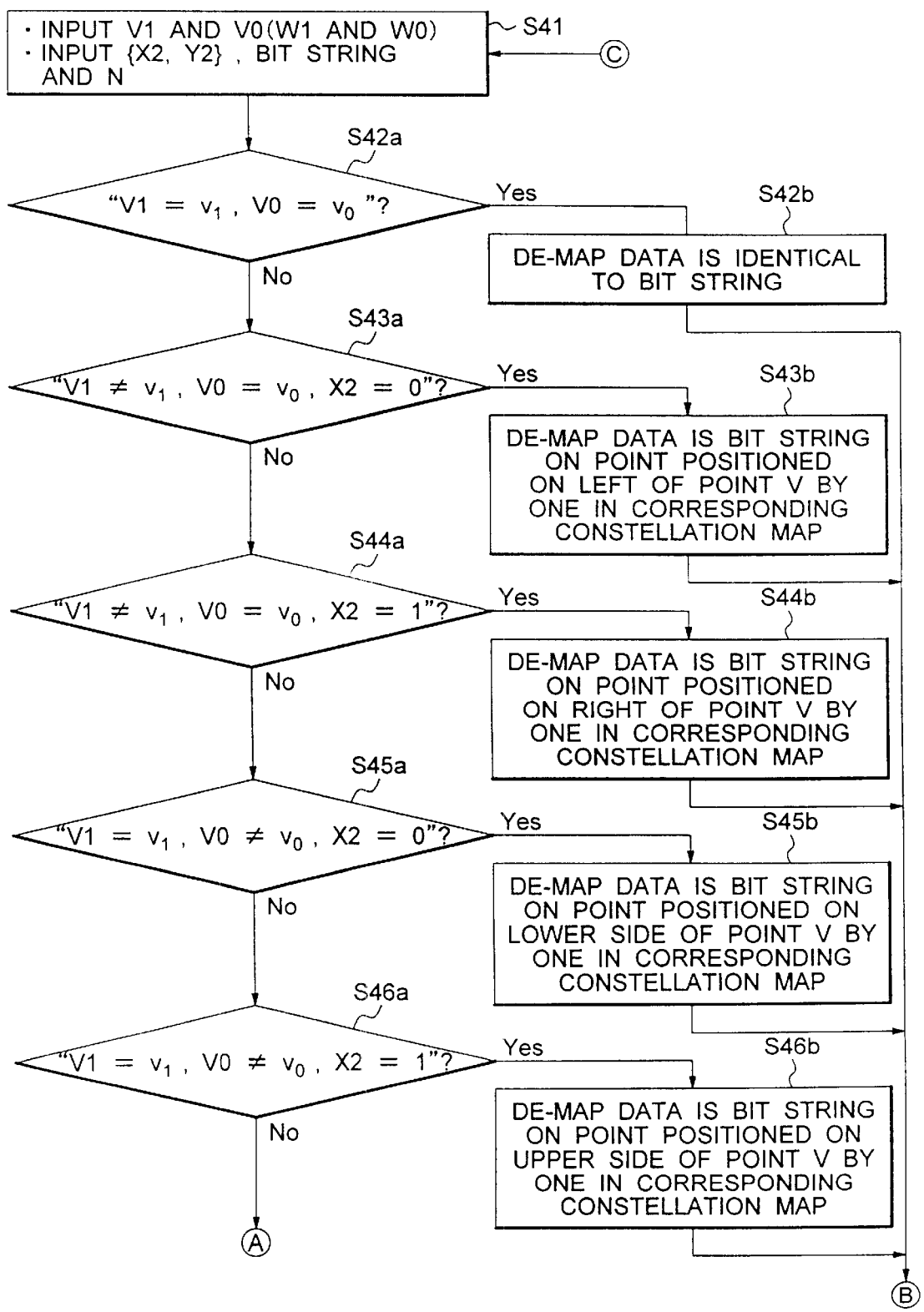
FIG. 10 is a flowchart showing the operation of a Viterbi post-processing circuit 9.
Figure 11:
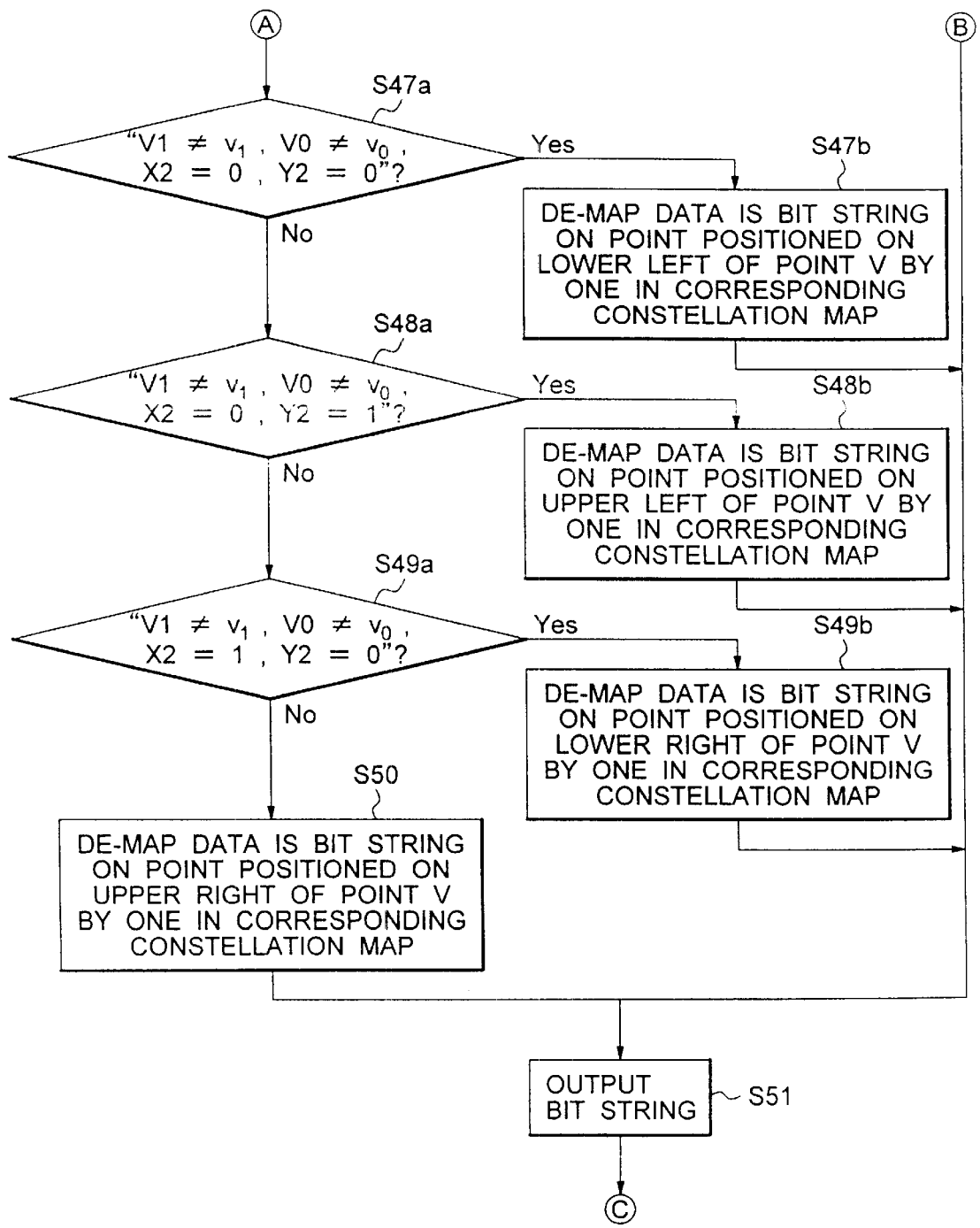
FIG. 11 is a flowchart showing the operation of the Viterbi post-processing circuit 9, illustrating the step next to FIG. 10.

Next, the operation according to the first embodiment having such a structure, that is, the Viterbi decoding method will be described. FIG. 5 is a flowchart showing the operation of the de-map circuit 1, FIG. 6 is a flowchart showing the operation of the tone ordering buffer memory 3, FIG. 7 is a flowchart showing the operation of the Viterbi pre-processing circuit 6, FIG. 8 is a flowchart showing the operation of the Viterbi decoding circuit 7, FIG. 9 is a flowchart showing the operation of the delay circuit 8, and FIGS. 10 and 11 are flowcharts sequentially showing the steps of the operation of the Viterbi post-processing circuit 9.

In the de-map circuit 1, first of all, an integer i is initialized to 0 as shown in FIG. 5 (Step S1).

Next, the high order 8 bits X' of the 11-bit receiving constellation X coordinate and the higher order 8 bits Y' of the 11-bit receiving constellation Y coordinate are input to read out the bit allocation number N of the i-th carrier from the receiving bit allocation table 2 (Step S2).

Then, the coordinates represented by X' and Y' are converted into a bit string of $\{v_{N-1}, v_{N-2}, \ldots v_1, v_0\}$ by using a constellation map applicable to the bit allocation number N (Step S3). If i is an odd number, the bit string is set to $\{w_{N-1}, w_{N-2}, \ldots w_1, w_0\}$. In the following description, if it is not specified, it is assumed that the bit string of $\{w_{N-1}, w_{N-2}, \ldots w_1, w_0\}$ is equivalent to the bit string of $\{v_{N-1}, v_{N-2}, \ldots v_1, v_0\}$.

Next, the bit string of $\{v_{N-1}, v_{N-2}, \ldots v_1, v_0\}$ obtained by the above-mentioned conversion is output (Step S4). At this time, if the bit number of the bit string is less than 15, 0 is added to a higher order and 15 bits are output.

Then, the integer i is increased by 1 (Step S5). As a result, if the integer i reaches 256, a process for one symbol is terminated. If the integer i is less than 256, the processes from the Step S2 to the Step S5 are repeated (Step S6).

The above-mentioned steps are carried out for all the symbols.

In the tone ordering buffer memory 3, first of all, the integer i is initialized to 0 as shown in FIG. 6 (Step S11).

Next, low order 3 bits of the receiving constellation X coordinate {X2, X1, X0}, low order 3 bits of the receiving constellation Y coordinate {Y2, Y1, Y0} and a bit string of $\{v_{N-1}, v_{N-2}, \ldots v_1, v_0\}$ are input. Furthermore, the bit allocation number N of the i-th carrier is read out and an address A corresponding to the i-th carrier is read out from the tone ordering table 5 (Step S12). {X2, X1, X0} and {Y2, Y1, Y0} are data for soft decision in the Viterbi decoding.

Then, {X2, X1, X0}, {Y2, Y1, Y0}, the bit string of $\{v_{N-1}, v_{N-2}, \ldots v_1, v_0\}$ and N are stored in the address A of the buffer memory 3 (Step S13).

Next, the processes from the Step S12 to the Step S13 are repeated until the integer i reaches 256 (Steps S14 and S15).

Furthermore, the integer i is initialized to 0 (Step S16).

Then, {X2, X1, X0}, {Y2, Y1, Y0}, the bit string of $\{v_{N-1}, v_{N-2}, \ldots v_1, v_0\}$ and N are read out from the address i of the buffer memory 3 (Step S17).

Thereafter, the read {X2, X1, X0}, {Y2, Y1, Y0}, the bit string of $\{v_{N-1}, v_{N-2}, \ldots v_1, v_0\}$ and N are output (Step S18).

Next, the steps from the Step S17 to the step S18 are repeated until the integer i reaches 256 (Steps S19 and S20).

Subsequently, the above-mentioned steps are carried out for all the symbols.

In the Viterbi pre-processing circuit 6, first of all, the integer i is initialized to 0 as shown in FIG. 7 (Step S21). Then, {X2, X1, X0}, {Y2, Y1, Y0}, the bit string of $\{v_{N-1}, v_{N-2}, \ldots v_1, v_0\}$ and N which are output from the buffer memory 3 are input (Step S22).

Then, $X_L$ comprising $\{v_1, X2, X1, X0\}$ and $Y_L$ comprising $\{v_0, Y2, Y1, Y0\}$ are created and are output to the Viterbi decoding circuit 7, and {X2, Y2} is created and {X2, Y2}, the bit string of $\{v_{N-1}, v_{N-2}, \ldots v_1, v_0\}$ and N are output to the delay circuit 8 (Step S23).

Next, the processes from the Step S22 to the Step S23 are repeated until the integer i reaches 256 (Steps S24 and S25). Then, the above-mentioned steps are carried out for all the symbols.

In the Viterbi decoding circuit 7, first of all, the integer i is initialized to 0 as shown in FIG. 8 (Step S31a).

Then, $X_L$ and $Y_L$ output from the Viterbi pre-processing circuit 6 are input (Step S32a). If i is an even number, $X_L$ is $\{v_1, X2, X1, X0\}$ and $Y_L$ is $\{v_0, Y2, Y1, Y0\}$. If i is an odd number, $X_L$ is $\{w_1, X2, X1, X0\}$ and $Y_L$ is $\{w_0, Y2, Y1, Y0\}$. As described above, moreover, {X2, X1, X0} and {Y2, Y1, Y0} are data for soft decision to be used for error correction in the Viterbi decoding operation.

Thereafter, $X_L$ and $Y_L$ are stored in a Viterbi processing memory (not shown) provided in the Viterbi decoding circuit 7 (Step S33a).

Next, the processes from the Step S32a to the Step S33a are repeated until the integer i reaches 256 (Steps S34a and S35a).

Subsequently, the Viterbi decoding process is carried out based on $X_L$ and $Y_L$ which are stored in the Viterbi processing memory, thereby creating low order 2 bits {V1, V0} of the corrected bit string (Step S36a). The Viterbi decoding process is simultaneously carried out for one set of carriers $\{v_1, v_0\}$ and $\{w_1, w_0\}$.

Furthermore, the integer i is initialized to 0 (Step S37a).

Next, the low order 2 bits {V1, V0} of the corrected bit string of the i-th carrier are output (Step S38a). If i is an odd number, the low order 2 bits are {W1, W0}.

Then, the process of the Step S38$a$ is repeated until the integer i reaches 256 (Steps S39$a$ and S40$a$).

Subsequently, the above-mentioned steps are carried out for all the symbols.

On the other hand, in the delay circuit 8, the integer i is initialized to 0 in the same timing as in the Step S31$a$ as shown in FIG. 7 (Step S31$b$).

Then, {X2, Y2}, the bit string of {$v_{N-1}$, $v_{N-2}$, ... $v_1$, $v_0$} and N which are output from the Viterbi pre-processing circuit 6 are input in the same timing as in the Step S32$a$ (Step S32$b$).

Thereafter, {X2, Y2}, the bit string of {$v_{N-1}$, $v_{N-2}$, ... $v_1$, $v_0$} and N are stored in a delay memory (not shown) provided in the delay circuit 8 in the same timing as in the Step S33$a$ (Step S33$b$).

Next, the process from the Step S32$b$ to the Step S33$b$ are repeated until the integer i reaches 256 (Steps S34$b$ and S35$b$).

Subsequently, the integer i is initialized to 0 in the same timing as in the Step S37$a$ (Step S37$b$).

Then, {X2, Y2}, a bit string of {$v_{N-1}$, $v_{N-2}$, ... $v_1$, $v_0$} and N of the i-th carrier are read out and output from the delay memory in the same timing as in the Step S38$a$ (Step S38$b$).

Thereafter, the process of the Step S38$b$ is repeated until the integer i reaches 256 (Steps S39$b$ and S40$b$).

Thus, the above-mentioned steps are carried out for all the symbols.

In the Viterbi post-processing circuit 9, first of all, the low order 2 bits {V1, V0} of the corrected bit string are input from the Viterbi decoding circuit 7 and {X2, Y2}, the bit string of {$v_{N-1}$, $v_{N-2}$, $v_1$, $v_0$} and N are input from the delay circuit 8 as shown in FIGS. 10 and 11 (Step S41).

If V1=$v_1$ and V0=$v_0$ are set up, the bit string of {$v_{N-1}$, $v_{N-2}$, ... $v_1$, $v_0$} are exactly output as the de-map data (Steps S42$a$, S42$b$ and S51).

If V1≠$v_1$, V0=$v_0$ and X2=0 are set up, a bit string corresponding to a point positioned on the left, by one, of a point V applied to {$V_{N-1}$, $V_{N-2}$, ... $v_1$, $v_0$} on the constellation map of the bit allocation number N (which is equivalent to a black circle on the left by one in FIG. 2, for example) is output as the de-map data (Steps S43$a$, S43$b$ and S51).

If V1≠$v_1$, V0=$v_0$ and X2=1 are set up, a bit string corresponding to a point positioned on the right of the point V by one (which is equivalent to a black circle on the right by one in FIG. 2, for example) is output as the de-map data (Steps S44$a$, S44$b$ and S51).

If V1=$v_1$, V0≠$v_0$ and Y2=0 are set up, a bit string corresponding to a point positioned on the lower side of the point V by one (which is equivalent to a black circle on the lower side by one in FIG. 2, for example) is output as the de-map data (Steps S45$a$, S45$b$ and S51).

If V1=$v_1$, V0≠$v_0$ and Y2=1 are set up, a bit string corresponding to a point positioned on the upper side of the point V by one (which is equivalent to a black circle on the upper side by one in FIG. 2, for example) is output as the de-map data (Steps S46$a$, S46$b$ and S51).

If V1≠$v_1$, V0≠$v_0$, X2=0 and Y2=0 are set up, a bit string corresponding to a point positioned on the lower left of the point V by one (which is equivalent to a black circle on the lower left by one in FIG. 2, for example) is output as the de-map data (Steps S47$a$, S47$b$ and S51).

If V1≠$v_1$, V0≠$v_0$, X2=0 and Y2=1 are set up, a bit string corresponding to a point positioned on the upper left of the point V by one (which is equivalent to a black circle on the upper left by one in FIG. 2, for example) is output as the de-map data (Steps S48$a$, S48$b$ and S51).

If V1≠$v_1$, V0≠$v_0$, X2=0 and Y2=1 are set up, a bit string corresponding to a point positioned on the lower right of the point V by one (which is equivalent to a black circle on the lower right by one in FIG. 2, for example) is output as the de-map data (Steps S49$a$, S49$b$ and S51).

If any of the above-mentioned cases is not applied, that is, V1≠$v_1$, V0≠$v_0$, X2=1 and Y2=1 are set up, a bit string corresponding to a point positioned on the upper right of the point V by one (which is equivalent to a black circle on the upper right by one in FIG. 2, for example) is output as the de-map data (Steps S49$a$, S50 and S51).

By repeating these steps 256 times, a process for one symbol is carried out. Subsequently, the above-mentioned steps are carried out for all the symbols. By the processing method described above, de-map data corrected for all the symbols are obtained.

Figure 12:
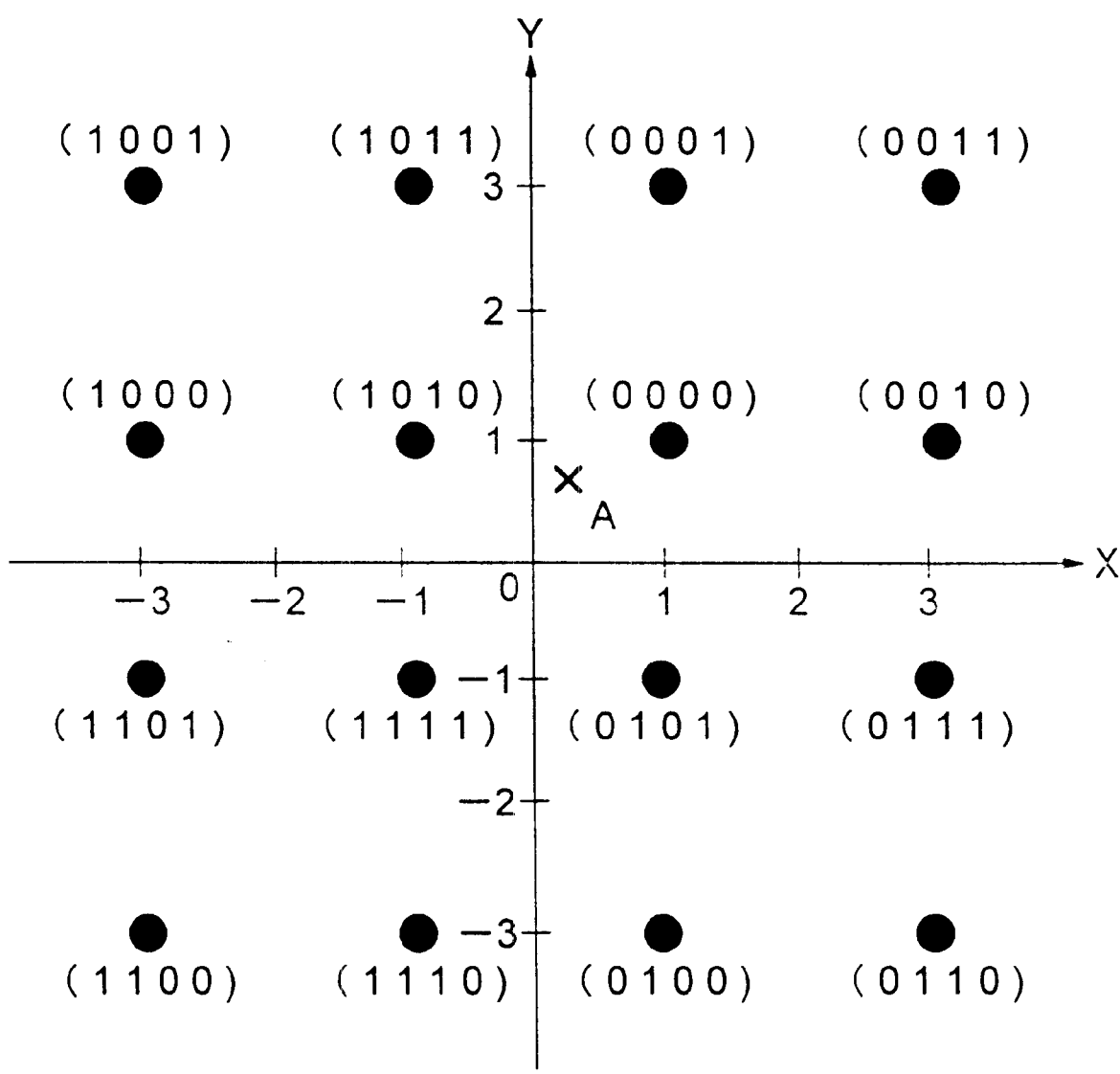
FIG. 12 is a diagram typically showing a receiving constellation coordinate.

In practice, the constellation map for 4 bits shown in FIG. 2 is used to carry out decoding in the following manner. FIG. 12 is a diagram typically showing receiving constellation coordinates.

For example, if the receiving constellation coordinate of a receiving point A in FIG. 12 is (0.25, 0.75), X' and Y' of high order 8 bits are "00000000" and "00000000" and {X2, X1, X0} and {Y2, Y1, Y0} of low order 3 bits are {0, 0, 1} and {0, 1, 1}, respectively. By the de-map circuit 1, a 4-bit string is output. In this case, {X', Y'} is {0, 0}. Therefore, one dot (1, 1) on a close point is selected so that a corresponding bit string is "0000". Then, the bit string is subjected to tone ordering by the buffer memory 3 and is then output to the Viterbi pre-processing circuit 6. Thereafter, data {0.01, 0.11} for soft decision is output from the Viterbi pre-processing circuit 6 to the Viterbi decoding circuit 7 together with $v_1$=0 and $v_0$=0. Moreover, {X2, Y2}={0, 0} as post-processing data, a bit string as de-map data and a bit allocation number N are output to the delay circuit 8. $v_1$ and $v_0$ are corrected in the Viterbi decoding circuit 7 based on the data for soft decision. As a result, V1 and V0 obtained by the correction are output to the Viterbi post-processing circuit 9. In this example, if a correct receiving point is (−1, −1), a corresponding correct bit string is "1111" and V1 and V0 obtained by the correction are 1 and 1. On the other hand, the delayed {X2, Y2}={0, 0}, a bit string of "0000", and a bit allocation number 4 are output from the delay circuit 8 to the Viterbi post-processing circuit 9.

In the Viterbi post-processing circuit 9, the bit string is then modified in relation to V1, V0 and the like which are error-corrected and output in the Viterbi decoding circuit 7, and the modified bit string is output as the de-map data.

In this example, V1≠$v_1$, V0≠$v_0$, X2=0 and Y2=0 are set up. Therefore, the de-map data is a bit string of "1111" corresponding to the point (−1, −1) on the lower left of a point (1, 1) based on the flowchart shown in FIGS. 10 and 11.

Next, a second embodiment of the present invention will be described. In the second embodiment, the capacity of a buffer memory can be more decreased and the scale of the Viterbi post-processing circuit can be more reduced than in the first embodiment. Also in the present embodiment, a noise enters during the transfer from a transmitter to a receiver in the same manner as in the first embodiment. Therefore, X and Y coordinates of a receiving constellation are input as 11-bit data comprising an integer part of 9 bits and a decimal part of 2 bits.

Figure 13:
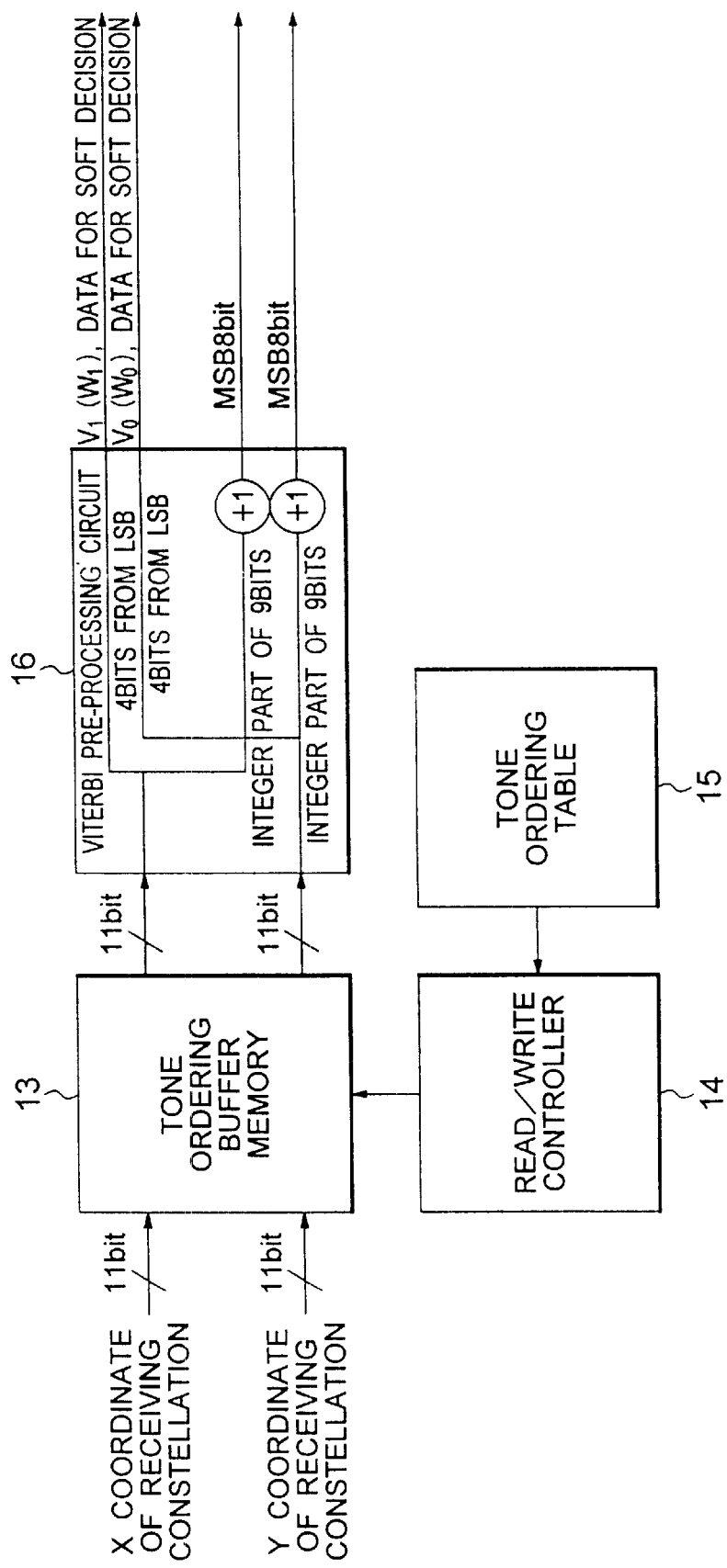
FIG. 13 is a block diagram showing a Viterbi decoder according to a second embodiment of the present invention.
Figure 14:
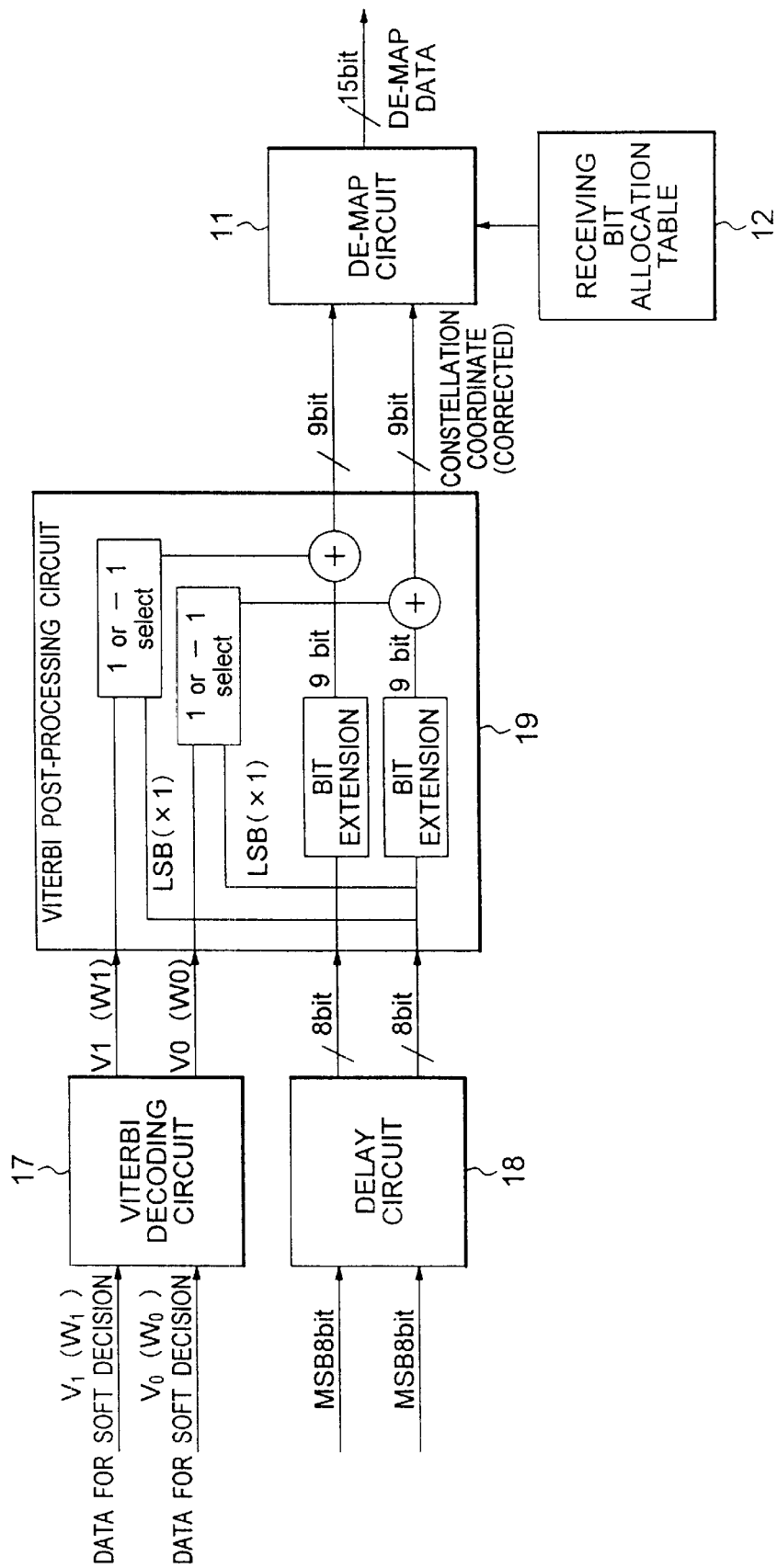
FIG. 14 is a block diagram showing the Viterbi decoder according to the second embodiment of the present invention, illustrating a next stage in FIG. 13.

Moreover, a constellation map to be used in the present embodiment is the same as that in the first embodiment. FIGS. 13 and 14 are block diagrams showing a Viterbi decoder according to the second embodiment of the present invention.

In the second embodiment, as shown in FIG. 13, there is provided a tone ordering buffer memory 13 for inputting an 11-bit receiving constellation X coordinate and an 11-bit receiving constellation Y coordinate. By the tone ordering buffer memory 13, data equivalent to carriers rearranged in order of a frequency by the transmitter are rearranged in order of an allocated bit number. In the same manner as in the first embodiment, furthermore, a read/write controller 14 and a tone ordering table 15 are provided.

Moreover, there is a Viterbi pre-processing circuit 16 for inputting the receiving constellation X and Y coordinates output from the tone ordering buffer memory 13. By the Viterbi Preprocessing circuit 16, data which are necessary for Viterbi decoding operation and data which are not necessary for the Viterbi decoding operation are separated and output.

According to the present embodiment, as shown in FIG. 14, a Viterbi decoding circuit 17, a delay circuit 18 and a Viterbi post-processing circuit 19 are further provided in the same manner as in the first embodiment.

There is provided a de-map circuit 11 for inputting a 9-bit receiving constellation X coordinate corrected and output from the Viterbi post-processing circuit 19 and the receiving constellation Y coordinate. In the same manner as in the first embodiment, moreover, a receiving bit allocation table 12 is provided. By the de-map circuit 11, the receiving constellation X and Y coordinates which are corrected are converted into a bit string based on a constellation map corresponding to an allocation bit number read from a receiving bit allocation table.

The second embodiment is greatly different from the first embodiment in that the de-map circuit for carrying out a de-map process is provided in the final stage.

Figure 15:
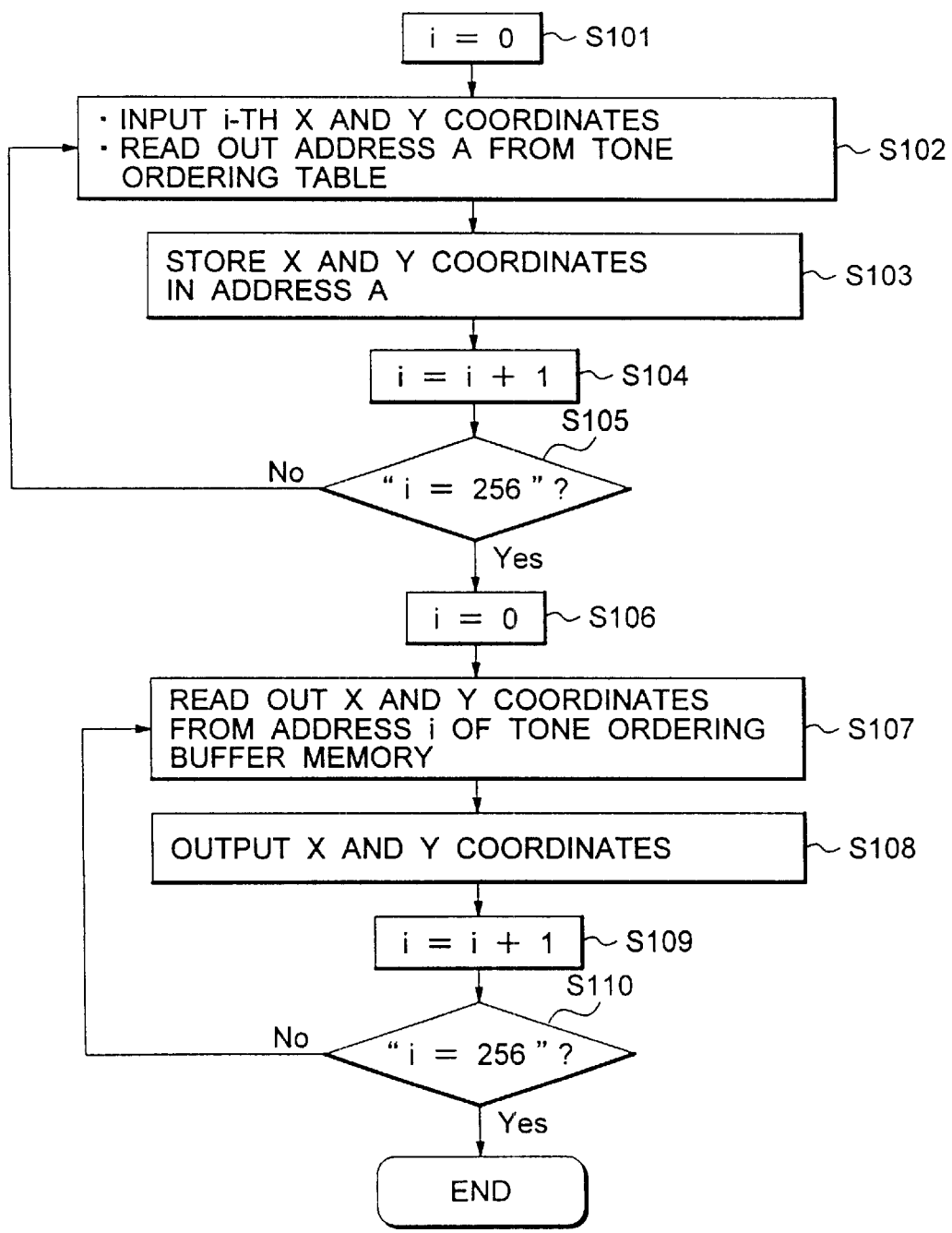
FIG. 15 is a flowchart showing the operation of a tone ordering buffer memory 13.
Figure 16:
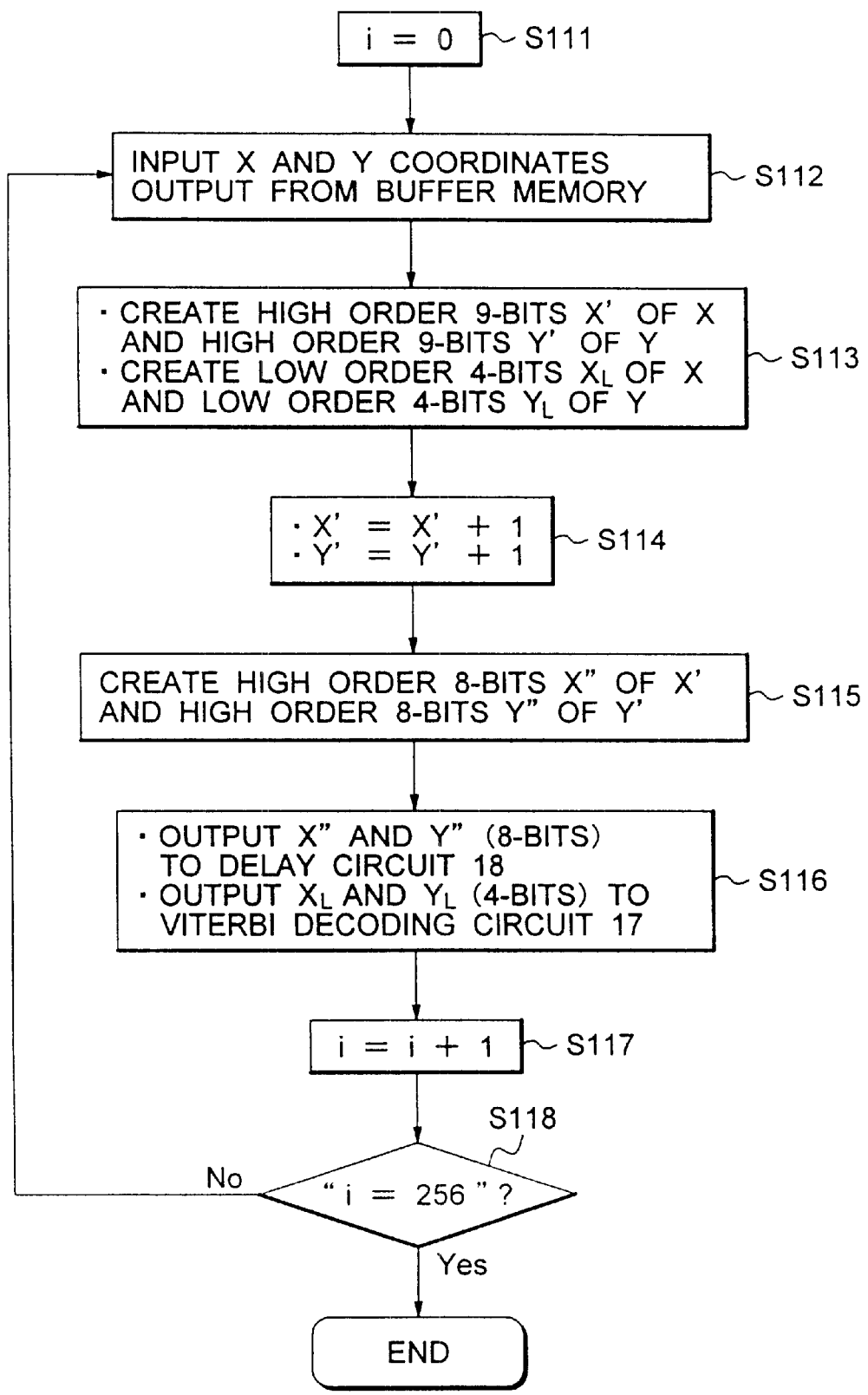
FIG. 16 is a flowchart showing the operation of a Viterbi pre-processing circuit 16.
Figure 17:
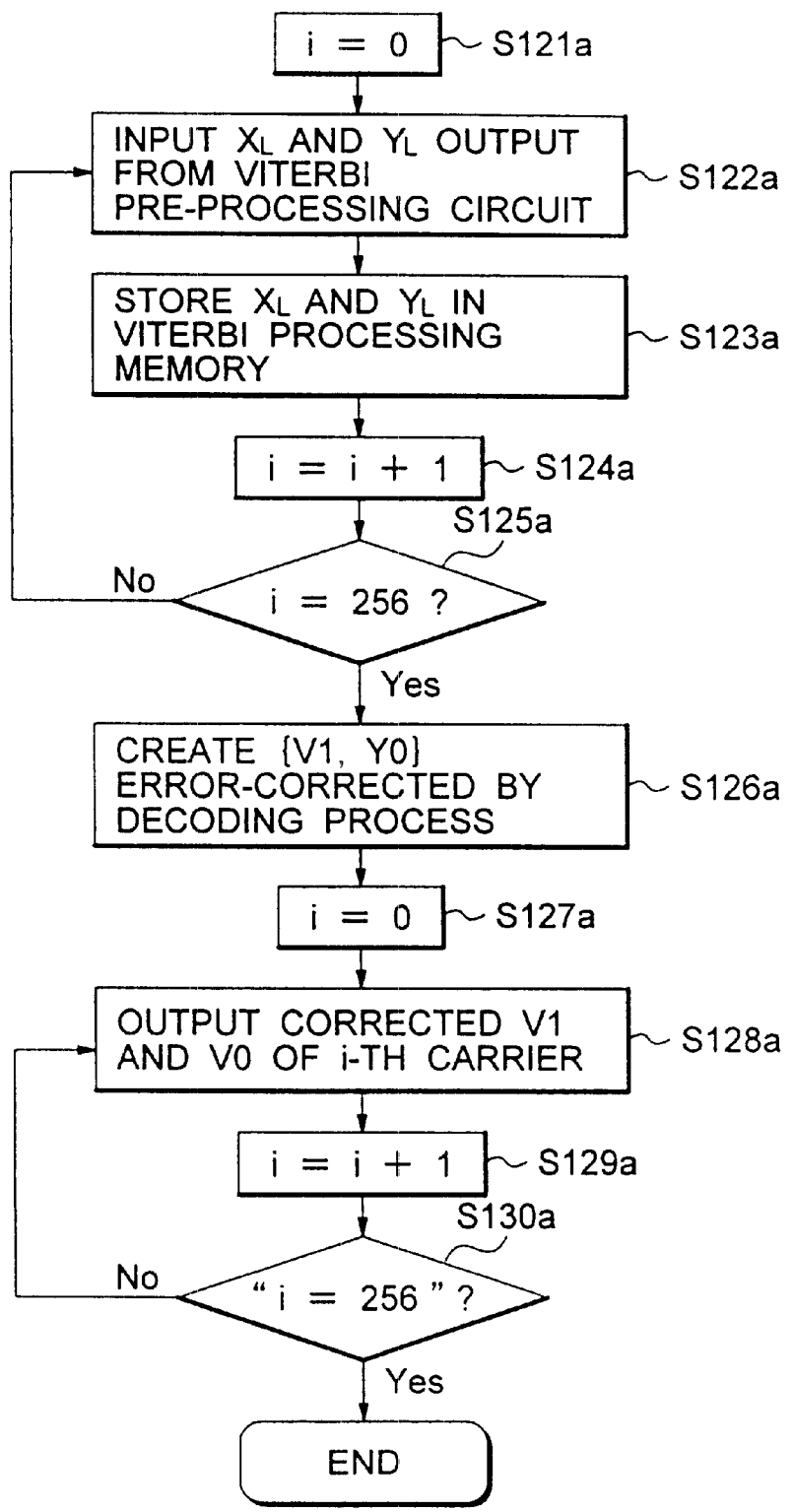
FIG. 17 is a flowchart showing the operation of a Viterbi decoding circuit 17.
Figure 18:
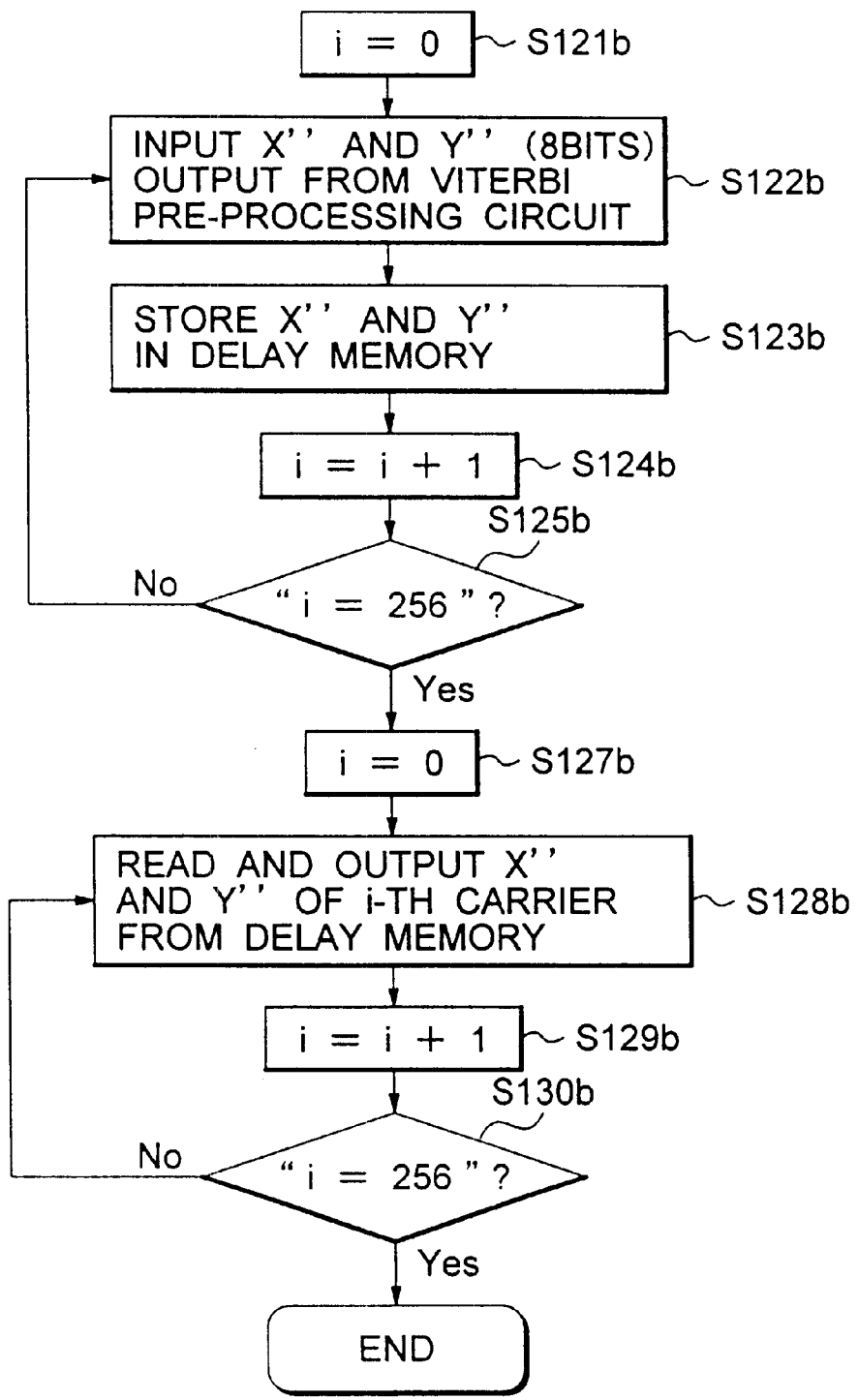
FIG. 18 is a flowchart showing the operation of a delay circuit 18.
Figure 19:
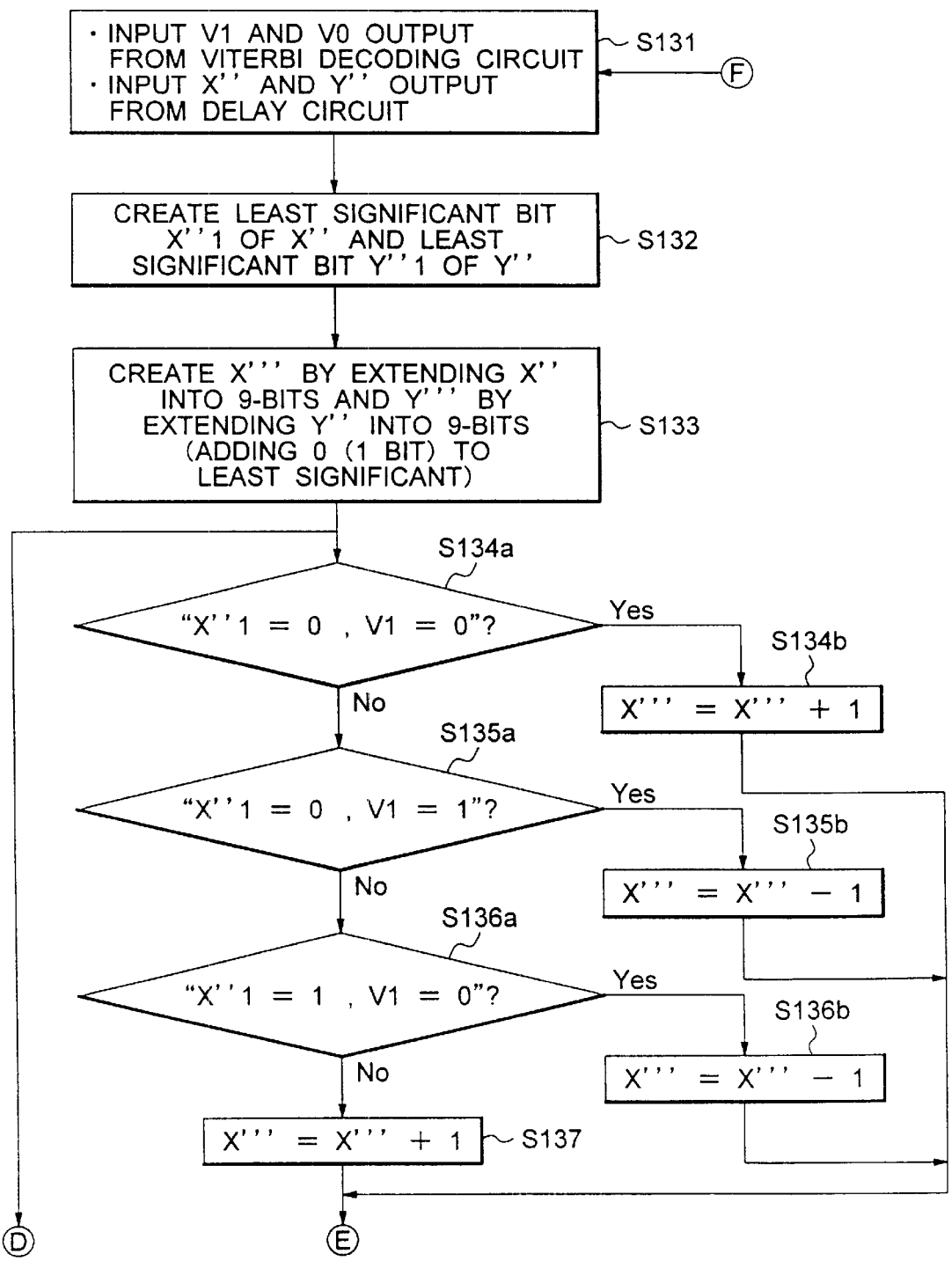
FIG. 19 is a flowchart showing the operation of a Viterbi post-processing circuit 19.
Figure 20:
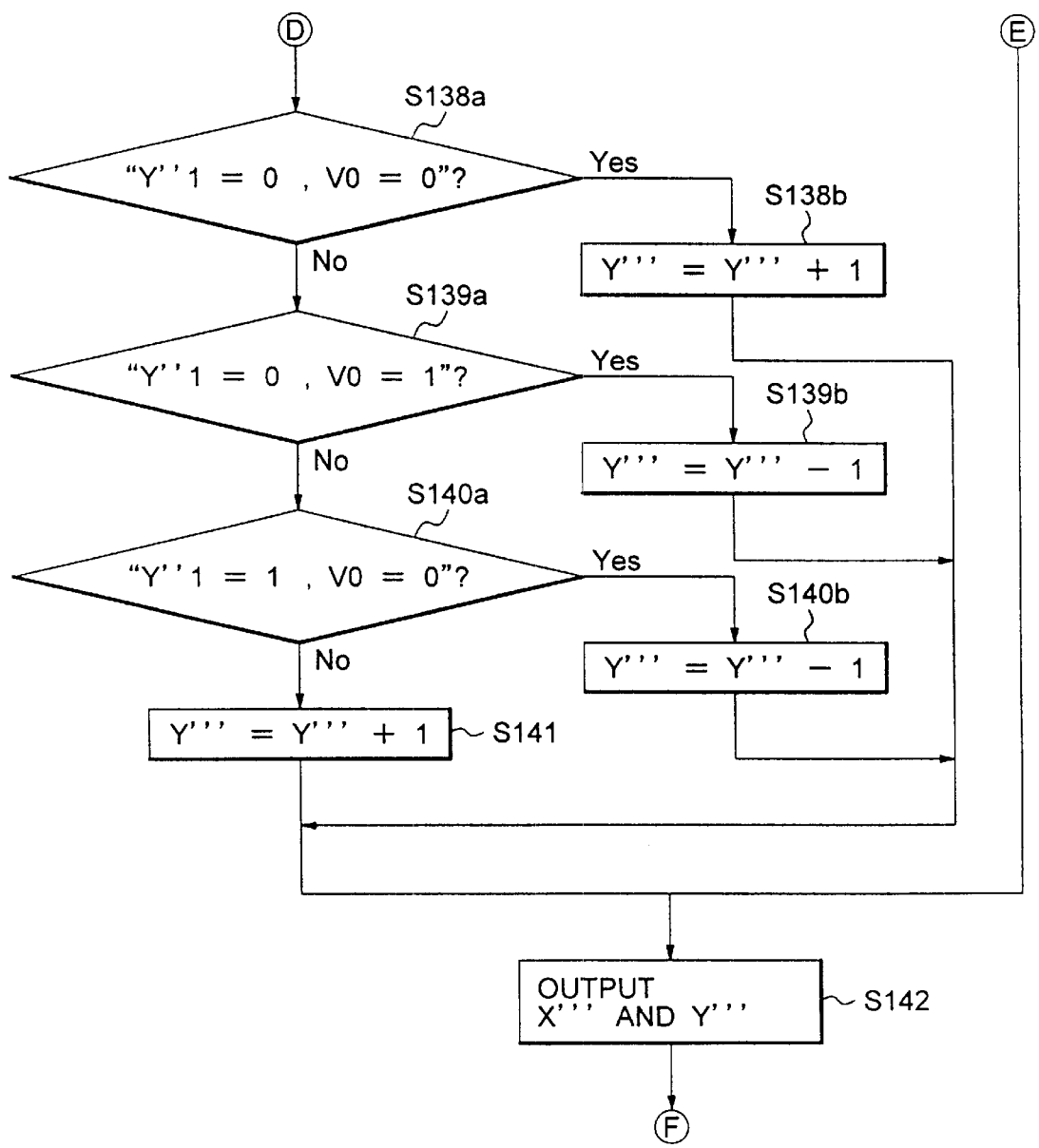
FIG. 20 is a flowchart showing the operation of the Viterbi post-processing circuit 19, illustrating the step next to FIG. 19.

Next, the operation according to the second embodiment having such a structure, that is, the Viterbi decoding method will be described. FIG. 15 is a flowchart showing the operation of the tone ordering buffer memory 13, FIG. 16 is a flowchart showing the operation of the Viterbi pre-processing circuit 16, FIG. 17 is a flowchart showing the operation of the Viterbi decoding circuit 17, FIG. 18 is a flowchart showing the operation of the delay circuit 18, FIGS. 19 and 20 are flowcharts sequentially showing the steps of the operation of the Viterbi post-processing circuit 19, and FIG. 21 is a flowchart showing the operation of the de-map circuit 11.

In the tone ordering buffer memory 13, first of all, an integer i is initialized to 0 as shown in FIG. 15 (Step S101).

Next, the 11-bit receiving constellation X and Y coordinates of the i-th carrier are input. Furthermore, an address A corresponding to the i-th carrier is read out from the tone ordering table 15 (Step S102).

Then, the receiving constellation X and Y coordinates are stored in the address A of the buffer memory 13 (Step S103).

Next, the processes from the Step S102 to the Step S103 are repeated until the integer i reaches 256 (Steps S104 and S105).

Furthermore, the integer i is initialized to 0 (Step S106).

Then, the receiving constellation X and Y coordinates are read out from the address i of the buffer memory 13 (Step S107).

Thereafter, the receiving constellation X and Y coordinates which are read out are output (Step S108).

Next, the processes from the Step S107 to the step S108 are repeated until the integer i reaches 256 (Steps S109 and S110).

Subsequently, the above-mentioned steps are carried out for all the symbols.

In the Viterbi pre-processing circuit 16, first of all, the integer i is initialized to 0 as shown in FIG. 16 (Step S111). Then, the 11-bit (an integer part of 9 bits and a decimal part of 2 bits) receiving constellation X and Y coordinates output from the buffer memory 13 are input (Step S112).

Then, high order 9 bits of the receiving constellation X and Y coordinates are fetched and set to X' and Y', respectively. In addition, low order 4 bits of the X and Y coordinates are set to $X_L$ {X3, X2, X1, X0} and $Y_L$ {Y3, Y2, Y1, Y0}, respectively (Step S113).

Next, 1 is added to X' and Y' (Step S114).

Then, 8 bits of X' and Y' to which 1 is added are set to X" and Y", respectively (Step S115). Furthermore, X" and Y" are output to the delay circuit 18 and $X_L$ and $Y_L$ are output to the Viterbi decoding circuit 17 (Step S116).

Next, the processes from the Step S112 to the Step S116 are repeated until the integer i reaches 256 (Steps S117 and S118).

Then, the above-mentioned steps are carried out for all the symbols.

In the Viterbi decoding circuit 17, first of all, the integer i is initialized to 0 as shown in FIG. 17 (Step S121a).

Then, $X_L$ and $Y_L$ output from the Viterbi pre-processing circuit 16 are input (Step S122a). If i is an even number, $X_L$ is {$v_1$ (X3), X2, X1, X0} and $Y_L$ is {$v_0$ (Y3), Y2, Y1, Y0}. If i is an odd number, $X_L$ is {$W_1$ (X3), X2, X1, X0} and $Y_L$ is {$w_0$ (Y3), Y2, Y1, Y0}. $v_1$ and $w_1$ are second bits from the least significant of a corresponding bit string, and $v_0$ and $w_0$ are the least significant bits of the corresponding bit string. As described above, the constellation map to be used in the present embodiment is set to obtain X3=$v_1$, Y3=$v_0$, X3=$w_1$ and Y3=$w_0$. Accordingly, $X_L$ and $Y_L$ can be represented as described above. In the same manner as in the first embodiment, moreover, {X2, X1, X0} and {Y2, Y1, Y0} are data for soft decision to be used for the Viterbi decoding.

Thereafter, $X_L$ and $Y_L$ are stored in a Viterbi processing memory (not shown) provided in the Viterbi decoding circuit 17 (Step S123a).

Next, the processes from the Step S122a to the Step S123a are repeated until the integer i reaches 256 (Steps S124a and S125a).

Subsequently, the Viterbi decoding process is carried out based on $X_L$ and $Y_L$ which are stored in the Viterbi processing memory, thereby creating low order 2 bits {V1, V0} of the corrected integer part (Step S126a). The Viterbi decoding process is simultaneously carried out for one set of carriers {$v_1$, $v_0$} and {$w_1$, $w_0$}.

Furthermore, the integer i is initialized to 0 (Step S127a).

Next, the low order 2 bits {V1, V0} of the corrected bit string of the i-th carrier are output (Step S128a). If i is an odd number, the low order 2 bits of the bit string are {W1, W2}.

Then, the process of the Step S128a is repeated until the integer i reaches 256 (Steps S129a and S130a).

Subsequently, the above-mentioned steps are carried out for all the symbols.

On the other hand, in the delay circuit 18, the integer i is initialized to 0 in the same timing as in the Step S121a as shown in FIG. 18 (Step S121b).

Next, X" and Y" output from the Viterbi pre-processing circuit 16 are input in the same timing as in the Step S122a (Step S122b).

Then, X" and Y" are stored in a delay memory (not shown) provided in the delay circuit 18 in the same timing as in the Step S123a (Step S123b).

Next, the processes from the Step S122b to the Step S123b are repeated until the integer i reaches 256 (Steps S124b and S125b).

Subsequently, the integer i is initialized to 0 in the same timing as in the Step S127a (Step S127b).

Then, X" and Y" of the i-th carrier are read out and output from the delay memory in the same timing as in the Step S128a (Step S128b).

Thereafter, the process of the Step S128b is repeated until the integer i reaches 256 (Steps S129b and S130b).

Thus, the above-mentioned steps are carried out for all the symbols.

In the Viterbi post-processing circuit 19, first of all, the low order 2 bits {V1, V0} of the corrected bit string are input from the Viterbi decoding circuit 17 and 8-bit X" and Y" are input from the delay circuit 18 as shown in FIGS. 19 and 20 (Step S131).

Next, the least significant bits of X" and Y" are set to X"1 and Y"1, respectively (Step S132).

Then, 1 bit of 0 is added under the least significant bits of X" and Y", thereby creating 9-bit X'" and Y'" respectively (Step S133).

If X"1=0 and V1=0 are set up for the X coordinate, 1 is added to X'" to create new X'" (Steps S134a and S134b).

If X"1=0 and V1=1 are set up, 1 is subtracted from X'" to create new X'" (Steps S135a and S135b).

If X"1=1 and V1=0 are set up, 1 is subtracted from X'" to create new X'" (Steps S136a and S136b).

If any of these is not set up, that is, X"1=1 and V1=1 are set up, 1 is added to X'" to create new X'" (Steps S136a and S137).

On the other hand, if Y"1=0 and V0=0 are set up for the Y coordinate, 1 is added to Y'" to create new Y'" (Steps S138a and S138b).

If Y"1=0 and V0=1 are set up, 1 is subtracted from Y'" to create new Y'" (Steps S139a and S139b).

If Y"1=1 and V0=0 are set up, 1 is subtracted from Y'" to create new Y'" (Steps S140a and S140b).

If any of these is not set up, that is, Y"1=1 and V0=1 are set up, 1 is added to Y'" to create new Y'" (Steps S140a and S141).

Then, X'" and Y'" are output (Step S142).

By repeating these steps 256 times, a process for one symbol is carried out. Then, the above-mentioned steps are carried out for all the symbols.

In the de-map circuit 11, first of all, an integer i is initialized to 0 as shown in FIG. 21 (Step S151).

Subsequently, 9-bit X'" and Y'" are input from the Viterbi post-processing circuit 19 and a bit allocation number N of the i-th carrier is read out from the receiving bit allocation table 12 (Step S152).

Then, coordinates represented by X'" and Y'" are converted into a bit string by using the constellation map equivalent to the bit allocation number N (Step S153).

Next, the bit string obtained by the above-mentioned conversion is output (Step S154).

Thereafter, the processes from the Step S152 to the Step S154 are repeated until the integer i reaches 256 (Step S155b and S156).

Thus, the above-mentioned steps are carried out for all the symbols. By the processing method described above, corrected de-map data can be obtained for all the symbols.

In practice, the constellation map for 4 bits shown in FIG. 2 is used to carry out the decoding operation in the following manner.

For example, if the receiving constellation coordinate (X, Y) of the receiving point A in FIG. 12 is (0.25, 0.75), high order 9 bits of X'=000000000 and Y'=000000000 of X and Y are generated in the Viterbi Preprocessing circuit 16, respectively. 1 is added to X' and Y' to obtain high order 8 bits X" of "00000000", and Y" "00000000". $X_L$ {X3, X2, X1, X0}={0, 0, 0, 1} comprising the low order 4 bits of X and $Y_L$ {Y3, Y2, Y1, Y0}={0, 0, 1, 1} comprising the low order 4 bits of Y are generated. Accordingly, $v_1$=X3=0 and $v_0$=Y3=0 and data for soft decision of {X2, X1, X0}={0, 0, 1} and {Y2, Y1, Y0}={0, 1, 1} are output from the Viterbi pre-processing circuit 16 to the Viterbi decoding circuit 17.

Moreover, data on a constellation coordinate to be used for a subsequent Viterbi post-processing circuit 19 (which is equivalent to {X'", Y'"} is rounded onto the nearest even dot (0, 0) to the point A. In other words, the receiving constellation coordinate is temporarily regarded as (0, 0).

Subsequently, $v_1$ and $v_0$ are error-corrected in the Viterbi decoding circuit 17. In this example, if a correct receiving point is (−1, −1), a corresponding bit string is "11111", and V1 and V0 obtained by the correction are 1, respectively. In this example, X"1=0, V1=1, Y"1=0 and V0=1 are obtained in the Viterbi post-processing circuit 19. Therefore, X'"=X'"−1 and Y'"=Y'"−1 are obtained from the flowcharts shown in FIGS. 19 and 20, and the coordinate (X'", Y'") obtained after the correction is (−1, −1). Subsequently, the dot of (−1, −1) is de-mapped by the de-map circuit 11 and "1111" is output as de-map data.

Also in the present embodiment, it is possible to carry out decoding operation with high precision in the same manner as in the first embodiment. Moreover, while (25 bits×256 words) is necessary for the capacity of the buffer memory 3 and (21 bits×256 words) is necessary for the capacity of the delay memory in the first embodiment, (22 bits×256 words) and (16 bits×256 words) are required respectively in the second embodiment. Accordingly, it is possible to reduce the capacity by approximately 20%. Furthermore, as is apparent from the comparison of FIGS. 7, 10 and 11 with FIGS. 16, 19 and 20, the processes in the Viterbi pre-processing circuit and the Viterbi post-processing circuit can be carried out more easily in the second embodiment. Therefore, it is possible to simplify the structures of the circuits.

As described above in detail, according to the first invention, the process is carried out in substantially reverse order to the process of the transmitter having a specification standardized. Therefore, it is possible to decode data with high precision.

According to the second invention, moreover, the errors of the coordinate data are corrected prior to the conversion into a bit string by utilizing the characteristics of the constellation map in which the low order bits of the bit string are related to X and Y coordinates. Therefore, it is possible to decode the data with high precision. In addition, the structure of the means for converting a bit string can be simplified still more. More specifically, according to the second embodiment, the capacities of the buffer memory and the delay memory can be reduced, the structures of the Viterbi pre-processing circuit and the viterbi post-processing circuit can be simplified and the number of transistors of a semiconductor chip for implementing the simplification can be decreased. Consequently, it is possible to reduce the size of the chip.

What is claimed is:

1. A Viterbi decoder comprising:
a coordinate data separating system which inputs coordinate data, and which outputs high order coordinate data and low order coordinate data, said coordinate data having an integer part of n bits and a decimal part of m bits which indicate a receiving constellation coordinate, said high order coordinate data having high order n−1 bits of said coordinate data, and said low order coordinate data having low order m+1 bits of said coordinate data;
a de-mapping system which converts said high order coordinate data into a predetermined bit string;
a Viterbi pre-processing system which inputs said low order coordinate data and said bit string, and which outputs correcting data, post-processing data and said bit string, said correcting data having low order m bits of said bit string and said low order coordinate data, and said post-processing data having high order 1 bit of said low order coordinate data;
a Viterbi decoding system which inputs said correcting data, and which outputs a corrected low order bit string, said corrected low order bit string being obtained by correcting a low order bit string having low order 2 bits of said bit string; and
a Viterbi post-processing system which inputs said corrected low order bit string, said post-processing data and said bit string, and which outputs a corrected bit string.

2. The Viterbi decoder according to claim 1, wherein said high order coordinate data is converted into said predetermined bit string by said de-mapping system in accordance with a constellation map corresponding to a bit allocation number thereof.

3. The Viterbi decoder according to claim 2, further comprises a receiving bit allocation table in which a plurality of bit allocation numbers are stored, said bit allocation number is read out from said receiving bit allocation table.

4. The Viterbi decoder according to claim 2, wherein said bit string is corrected by said Viterbi post-processing system using a constellation map corresponding to said bit allocation number.

5. The Viterbi decoder according to claim 1, wherein
there are a plurality of coordinate data,
said Viterbi decoder further comprises a rearrangement system which rearranges a plurality of low order coordinate data which correspond to each of said coordinate data and a plurality of bit strings, and
said low order coordinate data and said bit strings are input to said Viterbi pre-processing system through said rearrangement system.

6. The Viterbi decoder according to claim 5, wherein said low order coordinate data and said bit strings are stored in a buffer memory by said rearrangement system in accordance with a predetermined table.

7. The Viterbi decoder according to claim 1, wherein said post-processing data and said bit string which are output from said Viterbi pre-processing system are input to said Viterbi post-processing system through a delay circuit.

8. The Viterbi decoder according to claim 7, wherein said delay circuit has a delay time corresponding to a time at which said Viterbi decoding system carries out Viterbi decoding.

9. A Viterbi decoding method comprising the steps of:
separating coordinate data into high order coordinate data and low order coordinate data, said coordinate data having an integer part of n bits and a decimal part of m bits which indicate a receiving constellation coordinate, said high order coordinate data having high order n−1 bits of said coordinate data, and said low order coordinate data having low order m+1 bits of said coordinate data;
converting said high order coordinate data into a predetermined bit string;
generating correcting data and post-processing data from said low order coordinate data and said bit string, said correcting data having low order m bits of said bit string and said low order coordinate data, and said post-processing data having high order 1 bit of said low order coordinate data;
generating a corrected low order bit string from said correcting data, said corrected low order bit string being obtained by correcting a low order bit string having low order 2 bits of said bit string; and
generating a corrected bit string from said corrected low order bit string, said post-processing data and said bit string.

10. The Viterbi decoding method according to claim 9, wherein said high order coordinate data is converted into said predetermined bit string in accordance with a constellation map corresponding to a bit allocation number thereof in the step of converting said high order coordinate data into a bit string.

11. The Viterbi decoding method according to claim 10, wherein said bit allocation number is read out from a receiving bit allocation table in the step of converting said high order coordinate data into a bit string.

12. The Viterbi decoding method according to claim 10, wherein said bit string is corrected using a constellation map corresponding to said bit allocation number in the step of generating corrected bit string.

13. The Viterbi decoding method according to claim 9, wherein
there are a plurality of coordinate data,
the Viterbi decoding method further comprises the step of rearranging a plurality of low order coordinate data which correspond to each of said coordinate data and a plurality of bit strings, and
said correcting data and said post-processing data are generated after the step of rearranging a plurality of low order coordinate data and bit strings.

14. The Viterbi decoding method according to claim 13, wherein said low order coordinate data and said bit strings are stored in a buffer memory in accordance with a predetermined table in the step of rearranging a plurality of low order coordinate data and bit strings.

15. The Viterbi decoding method according to claim 9, further comprising the step of supplying said post-processing data and said bit string through a delay circuit to the step of generating said corrected bit string.

16. The Viterbi decoding method according to claim 15, wherein said delay circuit has a delay time corresponding to a time at which Viterbi decoding is carried out in the step of generating said corrected low order bit string.

17. A Viterbi decoder comprising:
a Viterbi pre-processing system which inputs coordinate data, and which outputs high order coordinate data and low order coordinate data, said coordinate data having an integer part of n bits and a decimal part of m bits which indicate a receiving constellation coordinate, said high order coordinate data having high order n−1 bits of said coordinate data, and said low order coordinate data having low order m+1 bits of said coordinate data;

a Viterbi decoding system which inputs said low order coordinate data, and which outputs post-processing data, said post-processing data being obtained by error-correcting high order 1 bit of said low order coordinate data;

a Viterbi post-processing system which inputs said high order coordinate data and said post-processing data, and which outputs error-corrected coordinate data; and a de-mapping system which converts said error-corrected coordinate data into a predetermined bit string.

18. The Viterbi decoder according to claim 17, wherein said error-corrected coordinate data is converted into said predetermined bit string by said de-mapping system in accordance with a constellation map corresponding to a bit allocation number thereof.

19. The Viterbi decoder according to claim 17, wherein
there are a plurality of coordinate data;
said Viterbi decoder further comprises a rearrangement system which rearranging a plurality of said coordinate data, and
said coordinate data are input to said Viterbi pre-processing system through said rearrangement system.

20. The Viterbi decoder according to claim 19, wherein said coordinate data are stored in a buffer memory by said rearrangement system in accordance with a predetermined table.

21. The Viterbi decoder according to claim 17, wherein said high order coordinate data output from said Viterbi pre-processing system are input to said Viterbi post-processing system through a delay circuit.

22. The Viterbi decoder according to claim 21, wherein said delay circuit has a delay time corresponding to a time at which said Viterbi decoding system carries out Viterbi decoding.

23. A Viterbi decoding method comprising the steps of:
generating high order coordinate data and low order coordinate data from coordinate data, said coordinate data having an integer part of n bits and a decimal part of m bits which indicate a receiving constellation coordinate, said high order coordinate being obtained by adding 1 to high order n bits of said coordinate data, and said low order coordinate having low order m+2 bits of said coordinate data;

generating post-processing data obtained by error-correcting high order 1 bit of said low order coordinate data from said low order coordinate data;

generating error-corrected coordinate data from said high order coordinate data and said post-processing data; and converting said error-corrected coordinate data into a predetermined bit string.

24. The Viterbi decoding method according to claim 23, wherein said error-corrected coordinate data is converted into said predetermined bit string in accordance with a constellation map corresponding to a bit allocation number thereof in the step of converting said error-corrected coordinate data into a bit string.

25. The Viterbi decoding method according to claim 23, wherein
there are a plurality of coordinate data,
said Viterbi decoding method further comprises the step of rearranging a plurality of said coordinate data, and
said high order coordinate data and said low order coordinate data are generated after the step of rearranging said coordinate data.

26. The Viterbi decoding method according to claim 25, wherein said coordinate data are stored in a buffer memory in accordance with a predetermined table in the step of rearranging said coordinate data.

27. The Viterbi decoding method according to claim 23, further comprising the step of supplying said high order coordinate data through a delay circuit to the step of generating said error-corrected coordinate data.

28. The Viterbi decoding method according to claim 27, wherein said delay circuit has a delay time corresponding to a time at which Viterbi decoding is carried out in the step of generating said post-processing data.

* * * * *